(12) United States Patent
Nishi

(10) Patent No.: US 6,841,323 B2
(45) Date of Patent: Jan. 11, 2005

(54) MASK PRODUCING METHOD

(75) Inventor: Kenji Nishi, Yokohama (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 10/648,518

(22) Filed: Aug. 27, 2003

(65) Prior Publication Data

US 2004/0036846 A1 Feb. 26, 2004

Related U.S. Application Data

(62) Division of application No. 09/736,423, filed on Dec. 15, 2000, now Pat. No. 6,653,025, which is a continuation of application No. PCT/JP99/03218, filed on Jun. 16, 1999.

(30) Foreign Application Priority Data

Jun. 17, 1998 (JP) .............................. 10-169721
Oct. 13, 1998 (JP) .............................. 10-290181

(51) Int. Cl.$^7$ .................................................. G03F 9/00
(52) U.S. Cl. ...................................................... 430/30
(58) Field of Search ........................... 430/30, 22, 296, 430/5

(56) References Cited

U.S. PATENT DOCUMENTS

| | | |
|---|---|---|
| 4,748,478 A | 5/1988 | Suwa et al. |
| 5,437,946 A | 8/1995 | McCoy |
| 5,477,304 A | 12/1995 | Nishi |
| 5,593,800 A | 1/1997 | Fujioka et al. |
| 6,204,912 B1 | 3/2001 | Tsuchiya et al. |
| 6,653,025 B2 * | 11/2003 | Nishi ......................... 430/5 |
| 2002/0187406 A1 | 12/2002 | Magome et al. |

FOREIGN PATENT DOCUMENTS

| | | |
|---|---|---|
| JP | 61-180275 | 8/1986 |
| JP | 63-18352 | 1/1988 |
| JP | 63-312636 | 12/1988 |
| JP | 2-139911 | 5/1990 |
| JP | 2-143513 | 6/1990 |
| JP | 6-132195 | 5/1994 |

* cited by examiner

Primary Examiner—Saleha R. Mohamedulla
(74) Attorney, Agent, or Firm—Oliff & Berridge, PLC

(57) ABSTRACT

A pattern region of a working reticle is divided into existing pattern portions and newly-forming pattern portions. With respect to the existing pattern portions, already-formed master reticle patterns are reduction-projected while stitching screens using an optical-type projection exposure apparatus. With respect to the newly-forming portions, enlarged patterns are formed by an electron beam drawing apparatus to form new master reticles, and reduced images of the newly formed master reticles are exposed while stitching screens using an optical-type projection exposure apparatus.

8 Claims, 21 Drawing Sheets

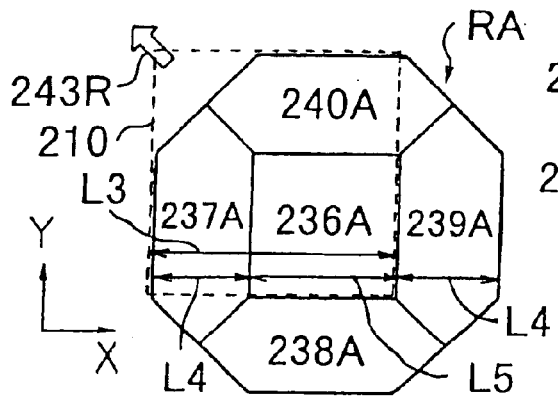
FIG.17A1
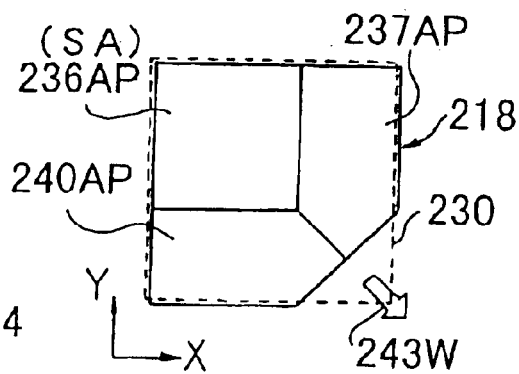
FIG.17A2
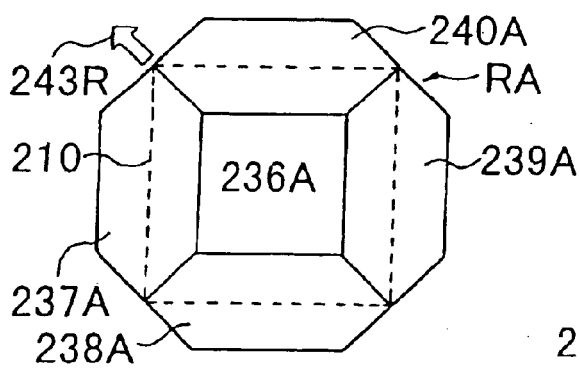
FIG.17B1
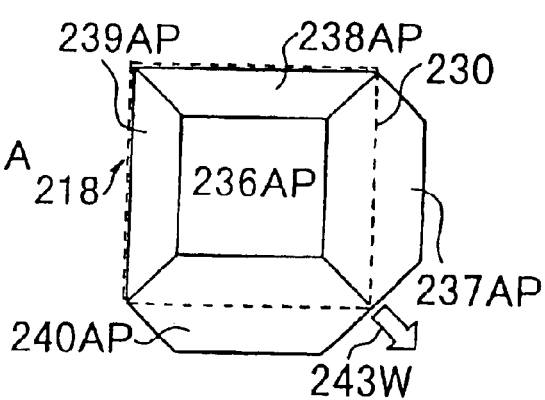
FIG.17B2
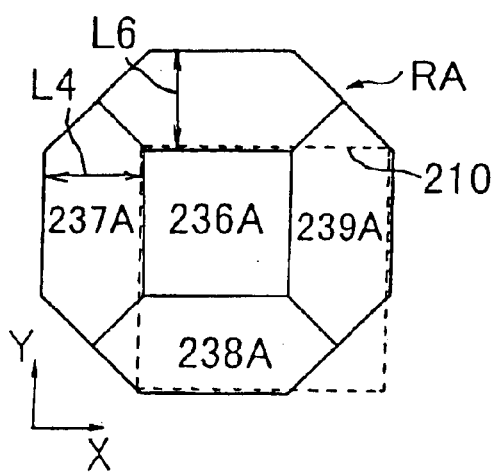
FIG.17C1
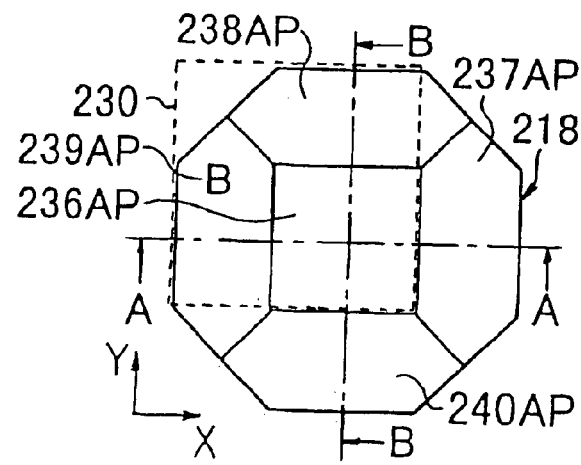
FIG.17C2

FIG.21A1
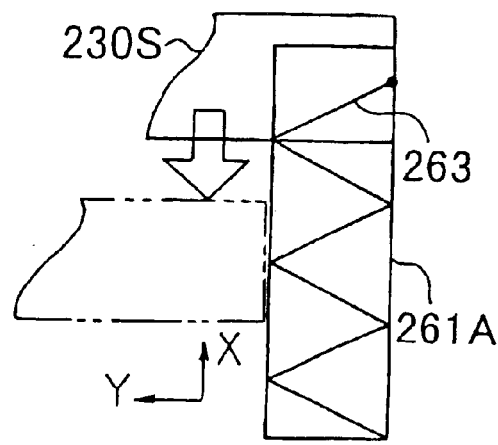
FIG.21A2
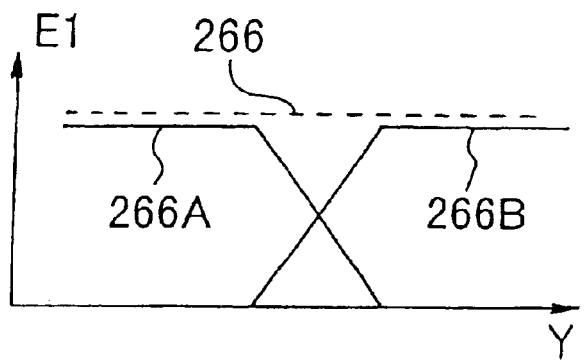
FIG.21B1
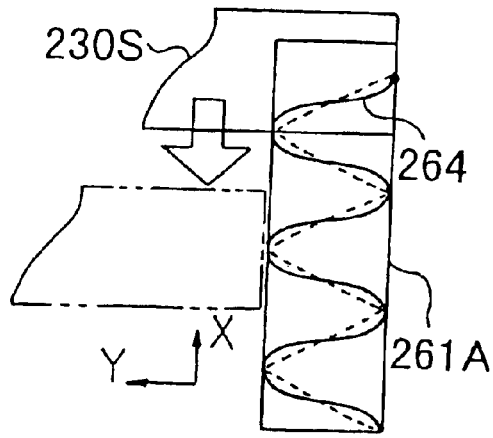
FIG.21B2
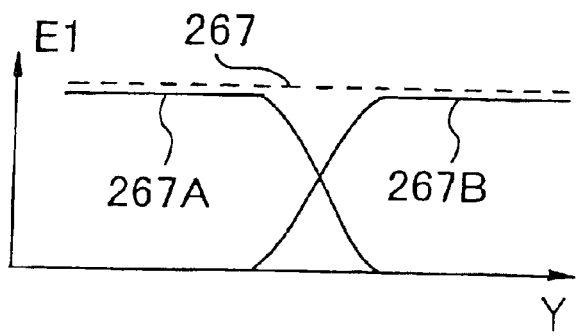
FIG.21C1
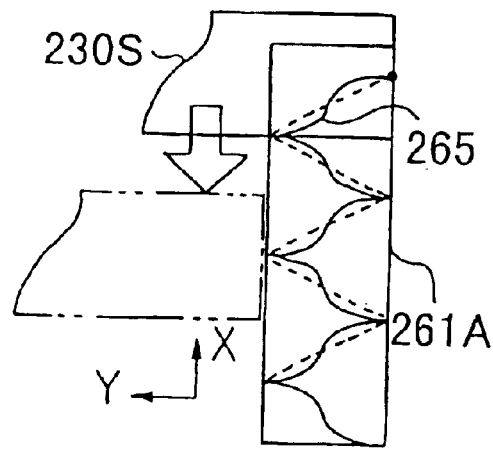
FIG.21C2
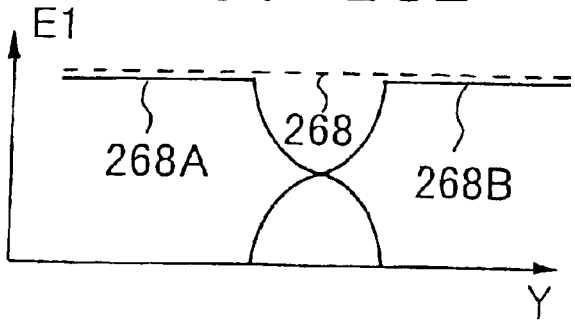

MASK PRODUCING METHOD

This is a Divisional of U.S. application Ser. No. 09/736,423 filed on Dec. 15, 2000 now U.S. Pat. No. 6,653,025, which in turn is a Continuation of PCT/JP99/03218 filed on Jun. 16, 1999, the contents of which are incorporated herein by reference in their entirety.

BACKGROUND OF THE INVENTION

1. Field of the Invention

The present invention relates to a producing method of a mask in which an original or master plate to be transferred onto a substrate such as a wafer in a lithography process for producing semiconductor devices, image pickup devices (CCDs etc.), liquid crystal displays, plasma displays, thin film magnetic heads and the like. The present invention also relates to an exposure method and an exposure apparatus used for this producing method. For example, the invention is suitably used for producing a mask and the like such as a transparent reticle using excimer laser as exposure beam, a reflective reticle using EUV light such as soft X-ray as the exposure light, and a membrane structure using electron beam as the exposure beam.

2. Description of the Related Art

Conventionally, when a semiconductor device is produced, in order to transfer a pattern of a reticle (or photo-mask) as a mask onto each shot region of a wafer on which a photoresist is applied, an i line (wavelength 365 nm) of a mercury lamp as exposure beam, or KrF excimer laser (wavelength 248 nm) is used, and a projection exposure apparatus (stepper or the like) using a projection optical system having the number of openings NA of about 0.7 is used. If a wavelength of the exposure beam is defined as $\lambda$ and a predetermined process coefficient is defined as k, resolution on a wafer is expressed as. $k \times \lambda / NA$. Therefore, a conventional minimum line width of an image of a line and space pattern that can be transferred onto the wafer is about 180 nm. The size of the conventional reticle is usually 5×5 inches or 6×6.

In this case, since a projection magnification of a projection optical system is about ¼ or ⅕, a line width of a pattern of a reticle corresponding to the minimum line width (when the projection magnification is ¼) is about 720 nm. A conventional reticle having such a pattern is produced by directly forming the original pattern on a predetermined substrate using an electron beam drawing apparatus.

As described above, the conventional reticle is produced by directly forming, onto a substrate of about 6×6 inches at the maximum, an original pattern whose a minimum line width becomes about 180 nm on a wafer. However, since the electron beam drawing apparatus continuously forms various portions of the original pattern with beams of a predetermined cross sectional shape, there is inconvenience that the pattern-forming time becomes long and the producing time of reticle becomes long. Especially, since the same reticles are usually used as working reticles concurrently by a plurality of producing lines, it is necessary to produce a plurality of reticles having the same original pattern. At that time, the pattern of each of the working reticles is formed by the electron beam drawing apparatus, time required for producing the reticles becomes extremely long.

Further, precision of about 5% of the minimum line width in an entire surface of the reticle is required as pattern-forming precision. Therefore, if the minimum line width is 720 nm, precision of about 36 nm is required. Thus, when the size of the reticle is 6×6 inches, precision of about 36 nm ($\sim 2.4 \times 10^{-7}$) is required for length of about 1.50 mm. Such precision is almost limit of the current electron beam drawing apparatus when drift of electron beam is taken into consideration.

Further, the resolution will further be improved so as to meet the increased packing density of the semiconductor device and the like. That is, for future several years, in order to transfer a pattern having the minimum line width of about 180 to 100 nm onto a wafer, ArF excimer laser light (wavelength is 193 nm), $F_2$ laser light (wavelength is 157 nm) and laser light of vacuum ultraviolet (VUV) such as solid laser and the like are under review. As a reticle for exposure beam of the vacuum ultraviolet longer than about 100 nm, a transparent reticle using fluorite ($CaF_2$) as a substrate can be used.

In order to further enhance the resolution for the next generation semiconductor device, an exposure apparatus in which extreme ultraviolet light (EUV light) such as soft X-ray (wavelength is about 13 to 6 nm) is used as exposure beam, and reflection system of reduced magnification using a combination of about three to five concave mirrors and convex mirrors is used as the projection optical system is under development. When the EUV light is used, since there is not optical material having excellent transmittancy, it is considered that a reticle to be used is a transparent reticle.

The use of an electron beam exposure apparatus in which a mask (stencil mask or the like) of a membrane structure having predetermined opening patterns in thin film members formed on a wafer into a lattice shape is irradiated with electron beam, an image of the opening pattern in the film member is transferred onto a substrate to be exposed while stitching screens at reduced magnification, thereby transferring a pattern of large area at high resolution is also under review. It is expected that resolution of about 130 to 30 nm can be obtained using the exposure apparatus or the electron beam exposure apparatus using the EUV light.

In order to obtain resolution of about 180 to 30 nm on a wafer, if the projection magnification of the projection optical system is ¼, the minimum line width of the reticle pattern is about 720 to 120 nm. It is expected that the size of the future reticle will be about 9×9 inches. Therefore, if the pattern-forming precision is about 5% of the minimum line width, precision required for the electron beam drawing apparatus is about 36 to 6 nm (about $1.6 \times 10^{-7}$ to $2.6 \times 10^{-8}$) with respect to a length of about 230 nm, but it is difficult under present circumstances to realize such a high precision. Further, if the area of the reticle becomes greater and the pattern becomes finer, the pattern-forming time becomes longer. Therefore, especially when a plurality of working reticles are produced, there is inconvenience that the producing time becomes excessively long.

In recent years, attention is directed toward technique for disposing previously designed various circuit units such as CPU or memory into a predetermined arrangement, these units are connected to one another through wires, thereby producing a semiconductor device that can achieve a desired function as in a case in which ASIC (application-specific IC) is produced. According to this technique, it is possible to develop semiconductor devices having various functions in a short time and thus, it is expected that the technique will widely be utilized in fields of multimedia, digital TV and the like. However, in such a case also, if the original pattern of each reticle is formed using the electron beam drawing apparatus, since the producing time of the reticle becomes long, there is inconvenience that developing time can not be shortened so much especially when various semiconductor devices are developed.

Thereupon, recently, a method in which an original pattern having an enlarged pattern on a reticle is prepared, this original pattern is divided into a plurality of parent patterns, they are formed on master reticles, images of the patterns of the plurality of master reticles are transferred onto a glass substrate while stitching screens using reduction projection type exposure apparatus, thereby producing reticles (working reticles) for actually light exposure is under review. When the image is transferred while stitching screens in this manner, it is necessary to reduce stitching error of a boundary portion (stitching portion) of adjacent parent patterns, and to reduce variation in exposure light amount in the vicinity of the boundary portion.

As an exposure method that can be used to reduce the stitching error and to reduce variation in exposure light amount, there is a method as disclosed in Japanese Patent Application Laid-open No. 6-132195 and corresponding U.S. Pat. No. 5,477,304 in which in order to transfer an image of a reticle pattern in each shot region on a wafer while stitching the screens, illumination distribution of illumination region of the exposure light is formed into a trapezoidal shape in which opposite ends are gradually lowered, and image of adjacent reticle patterns are overlapped on a boundary portion of a predetermined width. As a first method for forming the illumination distribution of the illumination region into the trapezoidal shape, there is a method in which a disposing surface of a reticle blind (variable field aperture) for defining the illumination region is defocus on the illumination region (pattern surface of reticle). According to this method, however, when shape of the opening aperture of an illumination optical system is switched from a circle (normal illumination) to a plurality of decentered opening (deformed illumination), there is an adverse possibility that the shape of the illumination distribution is not trapezoidal shape.

In order to prevent the shape of the illumination distribution from being deformed, the defocus amount of the reticle blind may be varied in accordance with illumination condition for example, but there is inconvenience that the mechanism of the illumination optical system is complicated.

Further, in order to form the illumination distribution of the illumination region into substantially the trapezoidal shape, there is proposed a method for moving a blade constituting the reticle blind into exposure light. However, there is inconvenience that this method also complicates a driving mechanism of the reticle blind and the mechanism of the illumination optical system is complicated.

There is considered a method for forming the illumination distribution of the illumination region into the trapezoidal shape by making ends of the reticle blind disposed in conjugate position with the illumination region semi-transparent. According to this method, however, if a foreign substance is attached to the semi-transparent portion, uneven illumination is generated in the illumination region. In order to avoid this, it is necessary to enhance the precision of a dustproof mechanism for gas supplied to the illumination optical system. Therefore, there is inconvenience that the mechanism of the illumination optical system is complicated.

SUMMARY OF THE INVENTION

In view of the above circumstances, it is a first object of the present invention to provide a producing method of a mask capable of producing a mask on which a transfer pattern is formed in a short time with high precision.

It is a second object of the invention to provide a producing method capable of producing, in a short time, a mask having a pattern which can be formed by disposing various circuit units according to a predetermined positional relation and by connecting the units through wire patterns or the like.

It is a third object of the invention to provide a producing method of a mask on which a fine transfer pattern of a large area is formed in a short time with high precision.

It is a fourth object of the invention to provide a projection exposure method in which when a transfer pattern is divided into a plurality of patterns and images of the patterns are transferred while stitching screens, a mechanism of an illumination optical system is not complicated, stitching error of boundary portions of images between a plurality of patterns is reduced, and uneven exposure light amount in the vicinity of the boundary portion can be reduced.

It is a fifth object of the invention to provide a projection exposure method when one mask pattern is produced while stitching screens, stitching error of images of a plurality of patterns and the mask pattern can be produced with high precision.

It is another object to provide a projection exposure apparatus capable of carrying out the above projection exposure method, and a producing method of a device using the projection exposure method.

According to a first aspect of the present invention, there is provided a producing method of a mask formed with a transfer pattern and to be irradiated with a predetermined exposure beam, comprising:

making design data of an original pattern obtained by enlarging the transfer pattern applying photosensitive material into which a coloring matter which absorbs light in a predetermined wavelength region is mixed onto at least one first substrate, and forming at least a portion of the original pattern on the first substrate, developing the photosensitive material on the at least one first substrate, and with the at least one first substrate being used as a parent mask having a mask pattern made of the photosensitive material remained after developing the photosensitive material, exposing a reduced image of the pattern of the parent mask onto a second substrate while stitching the reduced image using a projection exposure apparatus which carries out reduction projection using illumination light in a wavelength region absorbed by the photosensitive material.

According to the mask producing method of the first aspect of the present invention, the original pattern obtained by enlarging the transfer pattern is formed on the first substrate by an electron beam drawing apparatus for example. Then, using photosensitive material left by development of the photosensitive material on the first substrate is used as the mask pattern, and the mask pattern is reduction projected using the exposure apparatus using light having wavelength region absorbed by coloring matter in the photosensitive material as exposure light. With this method, the mask can be produced at high speed without carrying out a step such as deposition of chromium film and etching with respect to the first substrate. This electron beam drawing apparatus may form the enlarged pattern of the transfer pattern. Thus, if the enlargement magnification is set to α, an influence of the pattern-forming error is reduced to about 1/α and thus, the transfer pattern is formed with high precision.

According to a second aspect of the present invention, there is provided a producing method of a mask formed with a transfer pattern, comprising dividing the transfer pattern into an existing pattern portion and a newly-forming pattern portion based on design data of the transfer pattern, forming an original pattern corresponding to a pattern of the newly-forming pattern portion onto a first substrate to prepare a first parent mask, and with a mask formed with another original pattern corresponding to a pattern of the existing pattern portion being used as a second parent mask, exposing images of patterns of the first and second parent masks onto a second substrate which is to become the mask while stitching the images.

According to the mask producing method of the second aspect of the present invention, only the original pattern corresponding to the newly-forming pattern is newly formed by the electron beam drawing apparatus for example, and an already-formed parent mask is commonly used for the second parent mask on which the original pattern corresponding to the existing pattern is formed. In this case, since the newly-forming pattern is a portion of the entire transfer pattern, if the ratio of the patern-forming error with respect to the entire length of the pattern to be formed is judged as being substantially constant, the pattern-forming error of the newly-forming pattern can be reduced as compared with a case in which the entire original pattern is formed. Therefore, as compared with a case in which the entire original pattern is formed by the electron beam drawing apparatus, it is possible to form the mask in a short time and with high precision.

According to a third aspect of the present invention, there is provided a producing method of a mask formed with a transfer pattern including a predetermined linear pattern, comprising:

diving an enlarged pattern of the transfer pattern into a plurality of parent patterns from a position corresponding to an intermediate portion of the linear pattern as a boundary portion, and projecting and exposing reduced images of the plurality of parent patterns onto a substrate which is to become the mask while stitching the reduced images, wherein, portions of the plurality of parent patterns corresponding to the boundary portion of the linear pattern are provided with overlapped portions each having a predetermined width in its longitudinal direction, and the overlapped portions are respectively provided with tapered portions each having a wide tip end.

According to the mask producing method of the third aspect of the present invention, the enlarged pattern is divided into a plurality of parent patterns, and the images of the parent patterns are transferred while stitching the screens. With this method, the transfer pattern having large area can be formed in a short time. If a design length of th overlapping portion of the reduced images of the plurality of parent patterns is defined as 2×ΔL, and if the reduced images are stitched and exposed, a boundary portion having a length of 2×ΔL and a thick central portion is formed in a state in which there is no positional deviation under normal exposure light amount. However, the overlapping portion is exposed twice and is also exposed to light that wraps around. This boundary portion can be made substantially flatly by increasing the exposure light amount (over exposure). At that time, even if the positioning error of about ±ΔL of the reduced images of the parent patterns is generated in the longitudinal direction and in a direction intersecting with the longitudinal direction, the boundary portion does not become thin. Therefore, a fine pattern can be formed with high precision.

According to a fourth aspect of the present invention, there is provided a projection exposure method, comprising: diving a predetermined pattern into a plurality of mask patterns, and exposing images of the plurality of mask patterns onto a substrate while stitching screens through a projection optical system, thereby transferring an entire image of the predetermined pattern onto the substrate, wherein when the predetermined pattern is divided into the plurality of mask patterns, boundary portions of adjacent two mask patterns are respectively provided with overlapping portions of superposed portions, when an image of each mask pattern of the plurality mask patterns is exposed onto the substrate through the projection optical system, the mask pattern and the substrate are moved in synchronously with a predetermined visual field of the projection optical system such that the pattern of the mask pattern other than the overlapping portion does not come out from the predetermined visual field and a pattern of the overlapping potion goes out from the visual field.

According to the projection exposure method of the fourth aspect of the present invention, by exposing the image while stitching the screens using a static exposure type (full field exposure type) projection exposure apparatus, the image of one pattern is transferred onto the substrate. That is,. as shown in FIG. 17A1, a substrate 218 is positioned such that most part of partial overlapping portions 237A and 240A in a mask pattern with respect to a visual field is within a visual field 210, and remaining overlapping portions 238A and 239A are out of the visual field 210. After the substrate 218 is positioned such that overlapping error is within a tolerance, the visual field 210 is irradiated with exposure beam with uniform illumination distribution.

Thereafter, the mask pattern is moved in a direction shown with an arrow 243R with respect to the visual field 210, and when the remaining overlapping portions 238A and 239A come within the visual field 210 completely as shown in FIGS. 17B1 and 17C1, the irradiation of the exposure beam is stopped. With this operation, the distribution of the exposing amount on the corresponding substrate 218 is formed into a trapezoidal shape as shown with a folded line 244A in FIG. 18A for example. That is, a trapezoidal illumination distribution can be obtained without complicating the mechanism of the illumination optical system, and uneven exposure light amount in the vicinity of the boundary portion obtained by overlapping the adjacent mask pattern images is reduced.

Further, as shown in FIGS. 17A2, 17B2 and 17C2, if the substrate 218 is moved with respect to an exposure region 230 that is conjugate with the visual field 210 in synchronism with movement of each mask pattern, the stitching error in the boundary portion of the adjacent mask pattern images is reduced by effect of average.

According to a fifth aspect of the present invention, there is provided a projection exposure method, comprising: diving a predetermined pattern into a plurality of mask patterns, and exposing images of the plurality of mask patterns onto a substrate while stitching screens through a projection optical system, thereby transferring an entire image of the predetermined pattern onto the substrate, wherein the predetermined pattern is divided into the plurality of mask patterns along at least a predetermined direction, boundary portions of adjacent two mask patterns in the predetermined direction are provided with overlapping portions of superposed portions, when an image of each mask pattern of the plurality of mask patterns is exposed onto the substrate through the projection optical system, in a state in which an image of a pattern, of the mask pattern, in a visual field which is fixed to the projection optical system and is elongated in the predetermined direction is exposed onto the substrate through the projection optical system, the mask pattern and the substrate are scanned in synchronously with each other at the same speed ratio as a projection magnification of the projection optical system in a direction intersecting substantially at right angles with the predetermined direction with respect to the visual field, and the mask pattern and the substrate are mov d in synchronously with each other in the predetermined direction in accordance with exposure time and a width of the overlapping portion of the mask pattern with respect to the visual field.

According to the projection exposure method of the fifth aspect of the present invention, one pattern image is transferred onto the substrate 259 by exposing the image using a scanning type projection exposure apparatus such as a step and scan type while stitching screens. At that time, as shown in FIG. 19 for example, widths (in a predetermined direction) of opposite side overlapping portions 253, 254 of a mask pattern 255 to be exposed and a portion 252 except these portions, 253, 254 are defined as L1 and L1, and a width of the visual field 210 on the mask pattern in the predetermined direction is defined as L2, the width L2 is set as follows:

$$L2=11+2\times L \quad (1)$$

In order to make the illumination distribution with respect to the overlapping portion such that the illumination distribution as a whole becomes smaller as approaching the end thereof, if a width in a scanning direction intersecting with the predetermined direction (direction to be scanned) of the visual field is defined as H and scanning speed of the mask pattern with respect to the visual field is defined as VR, it is desirable that the mask pattern is vibrated (moved) with amplitude L with respect to the direction to be scanned and with cycle TR satisfying the following conditions using one or more integers n as one example:

$$VR \times TR = H/n \quad (2)$$

i.e., $$TR = H/(n \times VR) \quad (3)$$

This means that when the mask pattern is moved through the width H of the visual field in the scanning direction, the mask pattern is vibrated n-times in the direction to be scanned as shown in FIGS. 19A to 19E. With this, the mask pattern is moved along a sinusoidal wave with respect to the visual field, the distribution of the exposure light amount on the substrate after the scanning exposure is formed into the trapezoidal shape as shown with a curved line 258A in FIG. 20 for example, and the uneven exposure light amount in the vicinity of the boundary portion obtained by overlapping the images of the adjacent mask patterns becomes small.

Further, if the substrate 259 is moved along a sinusoidal wave with respect to an exposure region 230S that is conjugate with the visual field 210S in synchronism with movement of each mask pattern along a sinusoidal wave as shown in FIG. 19F for example, the stitching error in the boundary portion of the adjacent mask pattern images is reduced by effect of average.

Furthermore, in the projection exposure methods of the fourth aspect and fifth asp ct of the present inv ntion, if a predetermined pattern to be transferred onto the substrate is one mask pattern, stitching error when the mask pattern is exposed to light by screen stitching method is reduced.

According to a sixth aspect of the present invention, there is provided a projection exposure apparatus which exposes a pattern formed on a mask, onto a substrate through a projection optical system, the projection optical system being an optical system which exposes an image of a pattern of the mask within a predetermined visual field onto the substrate, comprising:

a mask stage capable of holding the mask and moving in a predetermined direction, a substrate stage capable of holding the substrate and moving two-dimensionally including the predetermined direction, and a control system which drives the mask stage and the substrate stage to move the mask and the substrate in synchronous with each other in the predetermined direction such that, when an entire image of the pattern of the mask is exposed onto the substrate through the projection optical system, a portion of the pattern of the mask does not come out from the visual field and a pattern other than the portion goes out from the visual field.

According to the projection exposure apparatus of the sixth aspect of the present invention, the projection exposure method of the fourth aspect of the present invention can be carried out.

According to a seventh aspect of the present invention, there is provided a projection exposure apparatus which exposes a pattern formed on a mask onto a substrate through a projection optical system, the projection optical system being an optical system which exposes an image of the pattern of the mask in a visual field which is longer in a predetermined direction, comprising:.

a mask stage capable of holding the mask and moving in the predetermined direction and in a direction intersecting substantially at right angles with the predetermined direction, a substrate stage capable of holding the substrate and moving in a two-dimensional directions including the predetermined direction, and a control system which, when an image of a pattern of the mask in the visual field is exposed onto the substrate through the projection optical system, drives the mask stage and the substrate stage to move the mask stage and the substrate stage in synchronous with each other in a direction intersecting the predetermined direction substantially at right angles and to move the mask and the substrate in the predetermined direction in synchronous with each other such that an end of the pattern of the mask goes out from the visual field by a predetermined width.

According to the projection exposure apparatus of the seventh aspect of the present invention, the projection exposure method of the fifth aspect of the present invention can be carried out.

According to a eighth aspect of the present invention, there is provided a producing method of a device comprising a step for transferring a device pattern (including a mask pattern, a pattern for a semiconductor device, etc.) onto a work piece using a projection exposure method as recited in claim 4.

According to a ninth aspect of the present invention, there is provided a projection exposure method, comprising the step of transferring a mask pattern is transferred to a plurality block regions arranged in a first direction on a substrate through a projection optical system to form a predetermined pattern on the substrate, peripheral portions of the block regions being partially overlapped, wher in in order to transfer the mask pattern to one block region of the plurality of block regions; the mask pattern and the substrate are moved in synchronous with each other with respect to a predetermined region where energy beam is irradiated within a visual field of the projection optical system, and moving directions of the mask pattern and the substrate are set to a direction which is intersecting with the first direction and with a second direction which intersects with the first direction at right angles such that an irradiating amount of the energy beam is gradually reduced at the peripheral portion in the one block region with respect to the first direction.

BRIEF DESCRIPTION OF THE DRAWINGS

The above and further objects, features and advantages of the present invention will become more apparent from the following detailed description taken in conjunction with the accompanying drawings, wherein;

FIGS. 17A1, 17A2, 17B1, 17B2, 17C1 and 17C2 are explanatory diagrams when exposure is carried out while moving the master reticle RA and the glass substrate 218 in synchronism with each other in the second embodiment;

DESCRIPTION OF THE PREFERRED EMBODIMENTS

A preferred first embodiment of the present invention will be explained below with reference to the drawings.

Figure 1:
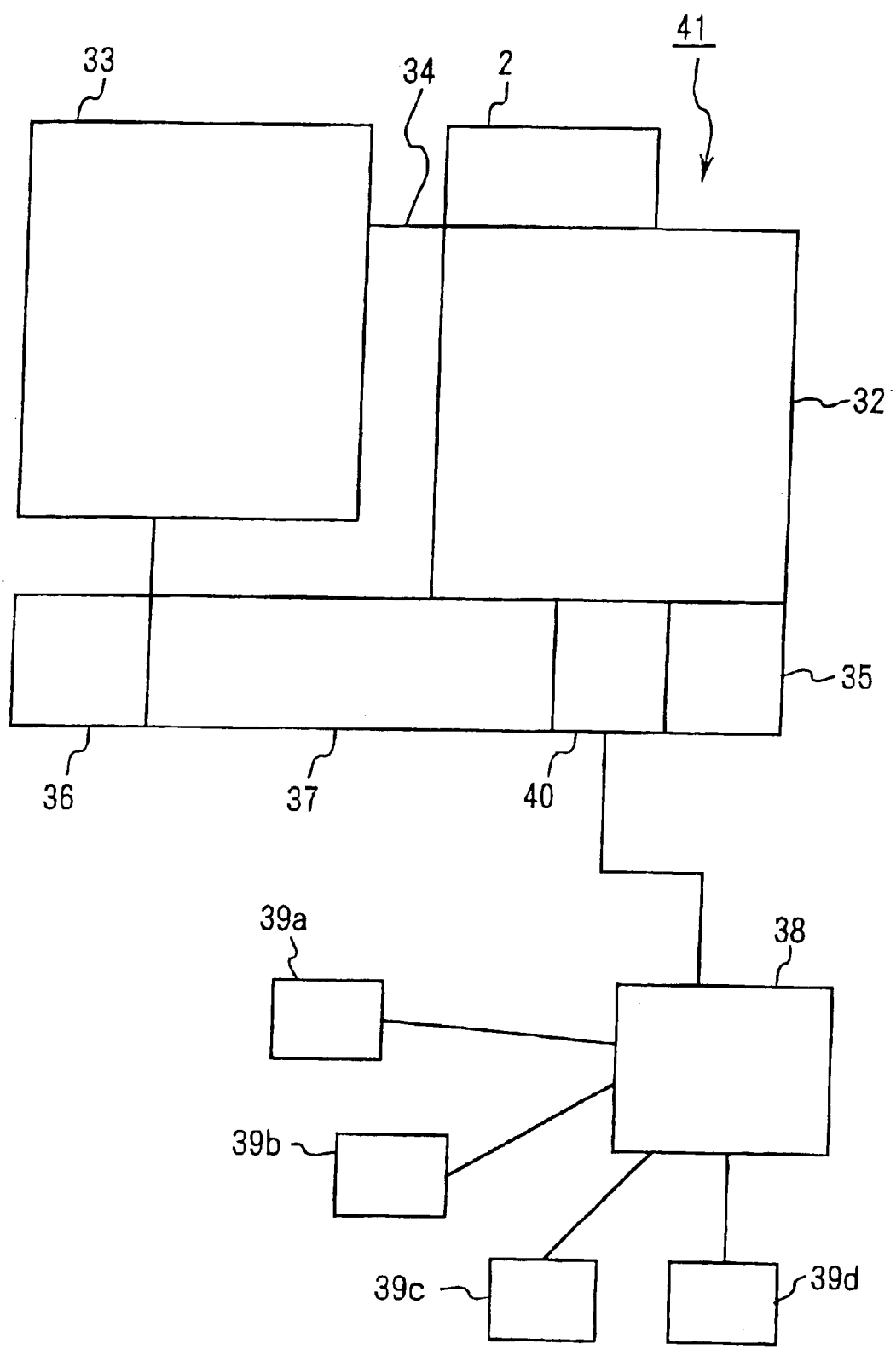
FIG. 1 is a block diagram showing a reticle designing system and a reticle producing system used in a first embodiment of the present invention.

FIG. 1 shows a designing system of a reticle as a mask, and a reticle producing system 41 for producing a working reticle on which a transfer pattern is formed that is designed by the reticle designing system. In FIG. 1, a reticle pattern corresponding to a circuit pattern of each layer of a semiconductor device is partially designed in each of design terminals 39a to 39d comprising compact computers. Allotment and the like of design regions in the terminals 39a to 39d are managed through a network by a circuit design centralized control apparatus 38 comprising a medium computer.

A reticle pattern designed in this manner has a portion requiring strict line width precision and a portion requiring relatively soft line width precision. In each of the terminals 39a to 39d, identification information for identifying a position of a circuit that can be divided (portion requiring soft line width precision) is generated, and this identification information is transmitted to the circuit design centralized control apparatus 38 together with design data of the partial reticle pattern. The circuit design centralized control apparatus 38 transmits design data information of the reticle pattern used in each layer, and the identification information indicating the position that can be divided, to a procedure managing apparatus 40 comprising a medium computer in the reticle producing system 41 through the network.

The reticle producing system 41 of the present embodiment divides an original pattern obtained by enlarging the reticle pattern with a predetermined magnification α (α is four times or five times) into a plurality of original patterns at dividing positions determined by the identification information, and forms these divided original patterns on the master reticles as parent masks. Alternatively, existing master reticle is used for a portion of the divided original pattern. Images obtained by reducing patterns of the plurality of master reticles in size into 1/α are exposed (stitched and exposed) to light on a predetermined substrate while stitching screens, thereby producing the working reticle used when a circuit pattern of each layer of a semiconductor device or the like is produced.

Main members constituting the reticle producing system 41 are, in addition to the procedure managing apparatus 40, an EB (electron beam) pattern-forming section 33, an excimer laser light source 2 as an exposure light source, an light exposing section 32, and a cotar developers section 37. The EB pattern-forming section 33 comprises, quartz, fluorite (CaF$_2$) or the like, and comprises an electron beam drawing apparatus for forming a predetermined new pattern on a substrate on which electron beam resist is applied using exposure beam. A reduction projection type projection exposure apparatus is constituted. The projection exposure apparatus carries out the stitching exposure of an image of a master reticle using excimer laser light as exposure light. The projection exposure apparatus of the present embodiment is largely different from a conventional photo repeater in that reduced image of various master reticles having different sizes are exposed to light while stitching scre ns.

In addition to the above members, disposed in the reticle producing system 41 are, cotar developer sections 37 existing in vacuum atmosphere in the EB pattern-forming section 33 and a predetermined atmospheric pressure atmosphere, substrate transfer section 34 for receiving and sending a substrate between the substrate transfer section 34 and the light exposing section 32, a substrate accommodating section 36 for accommodating a plurality of substrate for master reticles and working reticles, and an existing reticle accommodating section 35 for accommodating a plurality of master reticles on which existing patterns are previously formed on predetermined substrates by chromium deposition.

Next, a structure of the projection exposure apparatus comprising the excimer laser light source 2 and the light exposing section 32 will be explained with reference to FIG., 2. The projection exposure apparatus of the present embodiment is a step and scan type exposure apparatus using a catadioptric system as the projection optical system.

Figure 2:
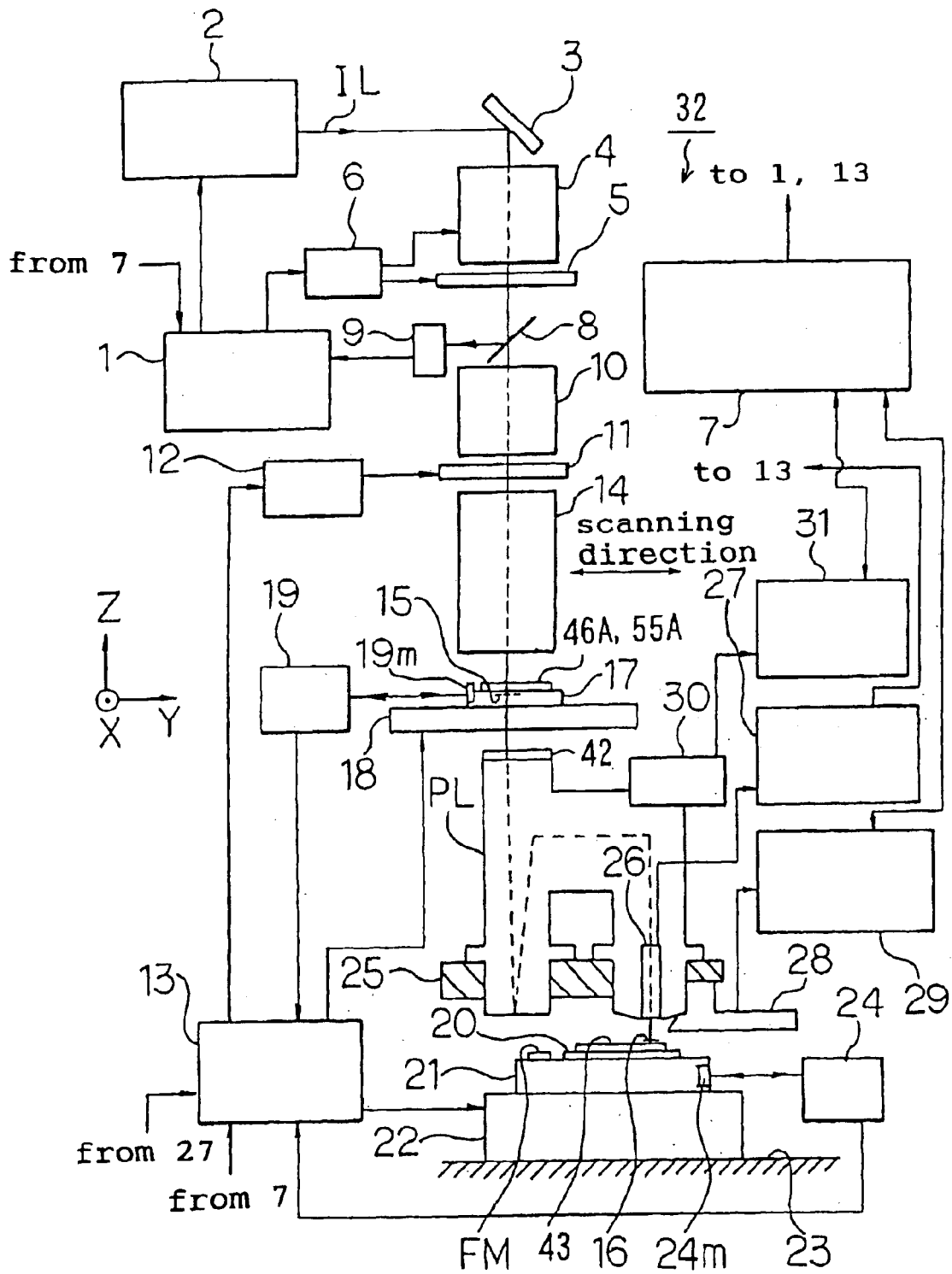
FIG. 2 is a block diagram showing a projection exposure apparatus comprising an excimer laser light source 2 and an light exposing section 32 in FIG. 1.

FIG. 2 shows the projection exposure apparatus of the present embodiment. In FIG. 2, as the excimer laser light source 2, an ArF excimer laser light source having a half-width of oscillation spectrum of about 1 pm or less when oscillation wavelength is 193 nm is used. A KrF excimer laser light source may be used instead. The invention can be applied even when an F$_2$ laser light (wavelength is 157 nm), a solid laser light source or a mercury lamp is used as the exposure light source. Illumination light IL comprising pulse light irradiated from the excimer laser light source 2 whose light-emitting state is controlled by an exposure control apparatus 1 is deflected by a mirror 3 and reaches a first illumination system 4.

The first illumination system 4 includes a beam expander, a light amount variation mechanism, a fly eye lens as an optical integrator (homogenizer) and the like. An ejection surface of the first illumination system 4 (ejection side focus surface of the fly eye lens in the present embodiment) is formed with a two-dimensional light source in which a large number of light source images are distributed in a surface-shape. A changing revolver 5 (corresponding to an aperture variable plate 205 of an example in FIG. 14) for variously changing illumination conditions is disposed on a formation surface of the two-dimensional light source. The changing revolver 5 is formed at its side surface with a normal circle opening aperture, so-called deformation illumination opening apertures comprising a plurality of openings deviated from the optical axis, a band-like opening aperture, a small α value-opening aperture and the like. A predetermined illumination system opening aperture (α aperture) is disposed on the ejecting surface of the first illumination system 4 by rotating the changing revolver 5 through a changing apparatus 6. For example, the illumination condition is optimized in accordance with a fine degree of a pattern of a master reticle as a parent mask which will be described later.

The operation of the changing apparatus 6 is controlled by the exposure control apparatus 1, and the operation of the exposure control apparatus 1 is controlled by a main control apparatus 7 that collectively controls the operation of the entire apparatus. In the present embodiment, in order to carry out the slicing exposure of reduced images of a plurality of master reticles 46A, 55A, . . . , exposure data of the master reticles are supplied by the procedure managing apparatus 40 shown in FIG. 1. In FIG. 2, light exposure of the master reticle 46 as a representative will be explained. The illumination light IL passing through the, illumination system opening aperture set by the changing revolver 5 enters a beam splitter 8 having great transmittancy. A very small amount of illumination light reflected by the beam splitter 8 is received by an integrator sensor 9 comprising a photodetector, and a detection signal of the integrator sensor 9 is supplied to the exposure control apparatus 1. The detection signal is used for indirectly monitoring the exposur light amount on the wafer.

Illumination light IL that passed through the beam splitter 8 illuminates an illumination visual field aperture system (reticle blind system) 11 through a second illumination system 10. The illumination visual field aperture system 11 is divided into a movable blind and a stationary blind. The stationary blind is a visual field aperture having a fixed thin and long rectangular opening. The movable blind includes two pairs of movable blades which can move independently in a scanning direction and in a direction to be scanned (to-be scanned direction, herein after) and which can open and close. A disposition surface of the stationary blind is separated from a conjugate surface of the pattern surface of the master reticle 46A through a predetermined distance in the optical axis direction. By opening the stationary blind, the illumination region with respect to the master reticle 46A is set to the thin and long rectangular shape. When the scanning exposure by the movable blind disposed on the conjugate surface of the master reticle 46A is started and completed, an opening of the stationary blind is gradually opened and closed respectively. With this operation, a region of the working reticle 43 other than its original exposure region as a substrate to be exposed is prevented from being irradiated with illumination light.

In the present embodiment, as will be described later, in the master reticle 55A, only a portion of pattern selected from the pattern region is exposed to light. Therefore, when only the portion of pattern is selected in this manner, the movable blind in the illumination visual field aperture system 11 is used. The operation of the movable blind in the illumination visual field aperture system 11 is controlled by a driving apparatus 12. When the master reticle 46A and the like and the working reticle 43 are scanned in synchronously with each other by a stage control apparatus 13, the stage control apparatus 13 drives the movable blind in synchronously through the driving apparatus 12. The illumination IL that passed through the illumination visual field aperture system 11 passes through a third illumination system 14 and illuminate the rectangular illumination region 15 of the pattern surface (lower surface) of the master reticle 46A with a uniform illumination distribution.

In the following explanation, the X axis is intersecting with a paper sheet of FIG. 2 in a plane that is in parallel to a pattern surface of the master reticle 46A that is being exposed to light, the Y axis is in parallel to the paper sheet of FIG. 2, and the Z axis is intersecting with the pattern surface. At that time, the scanning direction of reticle at the time of scanning and exposure is set into the Y direction. A pattern in the illumination region 15 on the master reticle 46A is reduced in size into projection magnification β (β is ¼, ⅕ or the like for example) through a projection optical system PL that is telecentric on both sides (or one side closer to an image side) held in a column 25, and projected onto an exposure region 16 on the working reticle 43 to which photoresist is applied. The projection magnification β is set to a reciprocal of the enlargement magnification α of the pattern of the working reticle (β=1/α).

The projection optical system PL is a catadioptric system having the number of openings NA of about 0.7, and a distortion correcting plate 42 for correctly correcting distortion is disposed on an upper end of an object surface side. In order to carry out the stitching exposure, for example, screens of reduced images which are adjacent to one another in lateral and vertical directions of the exposure region 16 of the projection optical system PL are stitched in some cases. In this case, if a distortion state is different depending upon a position in the exposure region 16, there is an adverse possibility that stitching error exceeding tolerance is generated. Thereupon, the distortion state in the exposure region 16 of the projection optical system PL is previously measured, and the distortion correcting plate 42 is formed with projections and depressions such that distortions in various positions in the exposure region 16 are within the tolerance based on the measured result. The splicing error due to the distortion can be reduced to an extremely low level by the distortion correcting effect and effect of averaging by means of scanning and exposure.

In FIG. 2, the master reticle 46A is held on a reticle stage 17. The reticle stage 17 can move at constant speed in the Y direction by a linear motor in a state in which the reticle stage 17 is placed on a reticle support base 18 through an air bearing. The reticle stage 17 can also move slightly in the X direction, the Y direction and the rotation direction (θ direction). A position of the reticle stage 17 (master reticle 46A) in the X direction and Y direction is always measured with resolution of about 0.001 μm (1 nm), and rotation angle of the reticle stage 17 is also measured. Based on the measured value, the stage control apparatus 13 controls the operation of the reticle stage 17.

In the present embodiment, since it is necessary to replace the plurality of master reticles 45A, 55A, . . . , a reticle library for accommodating enough reticles which are necessary for exposure, and a reticle replacing mechanism (not shown) are disposed in the vicinity of the reticle support base 18. The main control apparatus 7 replaces the master reticle on the reticle stage 17 at high speed through the reticle replacing mechanism in accordance with exposure sequence.

On the other hand, a substrate of the working reticle 43 to be produced is held on a sample stage 21 through a substrate holder 20, the sample stage 21 is placed on a substrate stage 22, and the substrate stage 22 is placed on a surface plate 23 through an air bearing. In this state, the substrate of the working reticle 43 can move at a constant speed in the Y direction by the linear motor, and can stepwisely move in the X direction and the Y direction. A Z stage mechanism for moving the sample stage 21 in the Z direction, and a tilt mechanism (leveling mechanism) for adjusting an inclination angle of the sample stage 21 are incorporated in the substrate stage 22.

A position of the sample stage 21 (working reticle 43) in the X direction and Y direction is always measured with resolution of about 0.001 μm (1 nm) by a moving mirror 24m fixed to a side surface of the sample stage 21 and a laser interferometer 24 fixed to a column (not shown), and rotation angle and tilt angle of the sample stage 21 are also measured. Based on the measured values, the stage control apparatus 13 controls the operation of the substrate stage 22. The substrate stage 22 of the present embodiment corresponds to a wafer stage of a normal exposure apparatus. The projection exposure apparatus of the present embodiment can also be used as an exposure apparatus for producing semiconductor devices by replacing the substrate holder 20 with a holder for semiconductor device wafer.

At the time of scanning and exposure, a command to start the exposure is sent from the main control apparatus 7 to the stage control apparatus 13, and in reply thereto, the stage control apparatus 13 scans the working reticle 43 in the Y direction at a speed of β×VR (β is projection magnification) through the substrate stage 22 in synchronously with the scanning of the master reticle 46A in the Y direction at a speed VR. An oblique-incidence type multipoint autofocus sensor ("AF sensor", herein after) 26 for measuring positions of a surface of the working reticle 43 at a plurality of measuring points in the Z direction (focus position) is disposed on a side surface of the projection optical system PL. Based on the measured value of the multipoint AF sensor 26, a focus/tilt control apparatus 27 obtains a focus position and an inclination angle of the surface of the working reticle 43. This measured value is supplied to the stage control apparatus 13 through the main control apparatus 7. Based on the supplied measured value, the stage control apparatus 13 controls a Z stage mechanism and the like in the sample stage 21 by an autofocus manner and an auto-leveling manner, and stitches the surface of the working reticle 43 with an image of the projection optical system PL.

An off-axis type alignment sensor 28 is fixed to a side surface of the projection optical system PL. At the time of alignment, a position of a mark (alignment mark) formed on an outer side of a pattern region for example of the working reticle 43 is detected by the alignment sensor 28 and an alignment signal processing apparatus 29 connected to the alignment sensor 28. A measured value of the laser interferometer 24 is also supplied to the alignment signal processing apparatus 29. The positions of the mark are coordinates on the stage coordinate system (X, Y) determined based on the X coordinate and Y coordinate measured by the laser interferometer 24. The positions of the mark are supplied to the main control apparatus 7. A pair of reticle alignment microscopes (although they are not illustrated, they corresponds to reticle alignment microscopes 232A and 232B in FIG. 16) for detecting positions of two alignment marks of the reticle are disposed on upper portions of the master reticle 46A. A reference mark member FM (corresponding to a reference mark member 224 in FIG. 16) on which a reference mark for alignment is formed is fixed in the vicinity of the substrate holder 20 on the sample stage 21.

At the time of alignment of the master reticle 46A, a positional deviation amount between the alignment mark on the master reticle 46A and a predetermined reference mark on the reference mark member FM is detected by the pair of reticle alignment microscopes. By adjusting the position of the reticle stage 17 such that the positional deviation amount is within a predetermined tolerance, the master reticle 46A is aligned with the stage coordinate system (X, Y). After that, a positional deviation amount between a detection center of the alignment sensor 28 and another reference mark on the reference mark member FM is detected, and a position of the mark on the working reticle 43 is detected by the alignment sensor 28. With the above operation, it is possible to expose a pattern image of the master reticle 46A at a desired position on the working reticle 43. Since only one layer may be exposed on the working reticle 43 in the present embodiment, it is not always necessary to use the alignment sensor 28, and even if the position of the working reticle 43 can be controlled only using the measured value of the laser interferometer 24, it is possible to carry out the stitching exposure with high precision.

Further, the projection optical system PL of the present embodiment is provided with a lens driving system 30 for slightly moving a predetermined lens in the projection optical system PL. When the main control apparatus 7 drives the lens driving system 30 through an image correcting apparatus 31, it is possible to restrict variation in image characteristics such as distortion of the projection optical system PL with respect to variation in atmospheric pressure.

Next, one example of the operation when a predetermined working reticle is produced using the reticle designing system and the reticle producing system will be explained with reference to flowcharts in FIGS. 8A to 8C. First, in step 101 in FIG. 8A, partial design data of a reticle to be produced, and identification information indicative of portion that can be divided (portion requiring soft line control precision in the present embodiment) are input to the circuit design centralized control, apparatus 38 by the terminals 39a to 39d shown in FIG. 1. The circuit design centralized control apparatus 38 transmits one design data of the reticle pattern obtained by collecting the entire partial design data and identification information corresponding thereto to the reticle producing system 41. In next step 102, the procedure managing apparatus 40 divides the reticle pattern into X number of existing pattern portions and N number of newly-forming pattern portions (N and M are integers equal to one or more) based on the design data of the supplied reticle pattern and the identification information.

In this case, using the projection magnification $\beta$ ($\beta$ is ¼, ⅕ or the like) of the light exposing section 32 shown in FIG. 1, the existing pattern portion is a pattern which is the same as a pattern of the master reticle for already produced device reduced in size by $\beta$ times. The master reticle in which the existing pattern is formed is accommodated in the existing reticle accommodating section 35 shown in FIG. 1. Whereas, the newly-forming pattern portion is a pattern that has not been formed or a pattern of a device that is not formed in the master reticle in the existing reticle accommodating section 35.

Figure 3A:
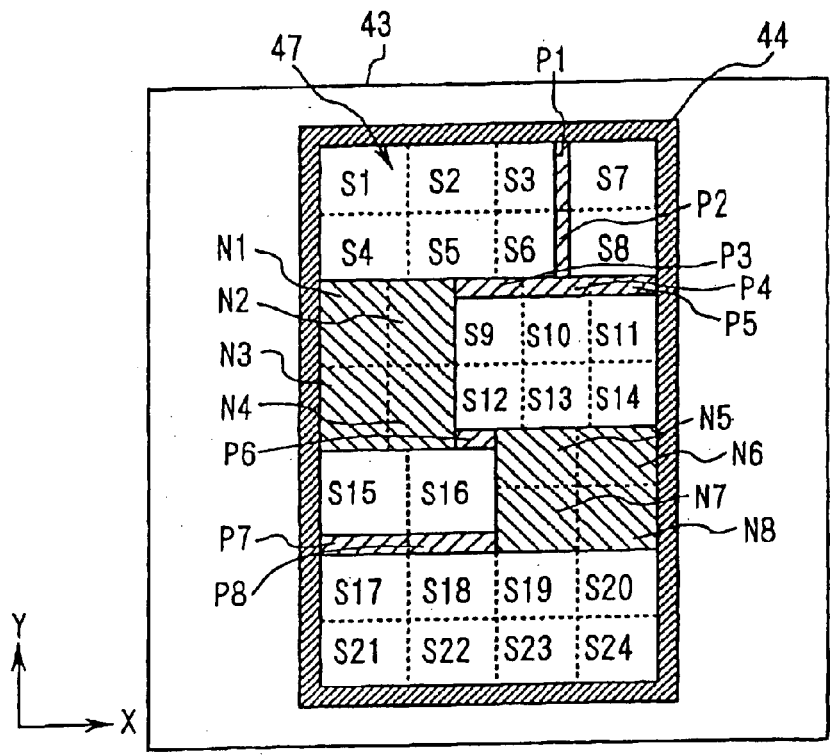
FIG. 3A is a plan view showing a working reticle 43 to be produced.

FIG. 3A shows one example of dividing method of a pattern of the working reticle 43 to be produced. In FIG. 3A, a pattern region 47 surrounded by a frame-likes light shield band 44 on the working reticle 43 is divided into 40 patterns comprising existing pattern portions S1 to S24, newly-forming pattern portions N1 to N8 having wide areas, and newly-forming pattern portions P1 to P8 having small area. The X direction and the Y direction in FIGS. 3A and 3B respectively correspond to the X direction and the Y direction in FIG. 2. It the patterns of the same kind (i.e., S1 to S6) a boundary line of division is shown with dotted line. A typical example of the existing pattern portions S1 to S24 comprises one pattern portion or a CPU or memory formed by stitching a plurality of pattern portions. On the other hand, an example of the newly-forming pattern portions P1 to P3 is a wire.

In this case, the procedure managing apparatus 40 transfers the M number of master reticles on which enlarged existing pattern portions S1 to S24 are formed using a reticle transfer mechanism (not shown), and accommodates the M number of master reticles in a reticle library (not shown) of the projection exposure apparatus (light exposing section 32) shown in FIG. 2.

Figure 4:
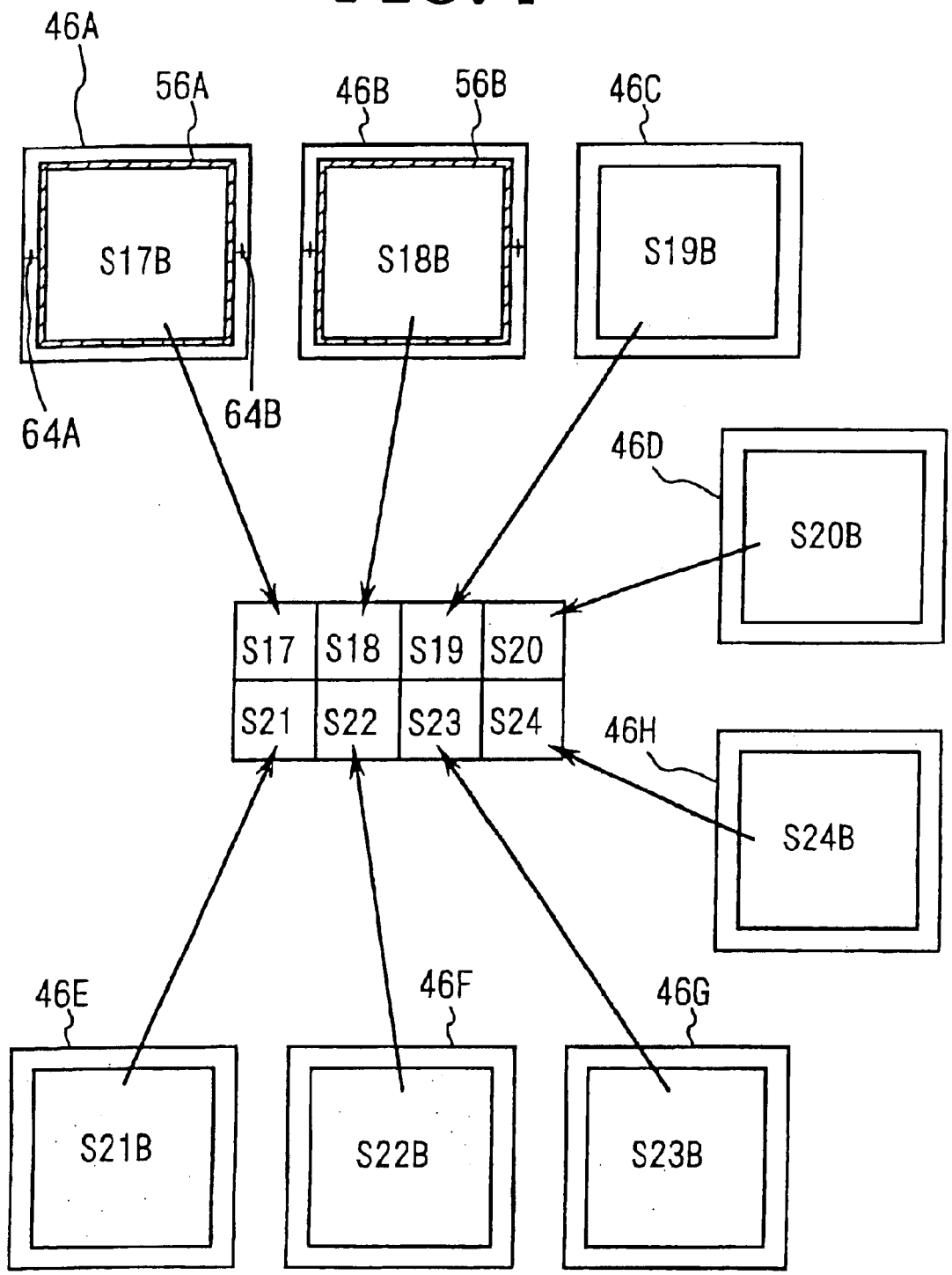
FIG. 4 is a diagram showing a master reticle corresponding to partial existing pattern portion shown in FIG. 3A.

FIG. 4 shows some of master reticles. In FIG. 4, original patterns S17B to S24B obtained by enlarging the existing pattern portions S17 to S24 with magnification of 1/$\beta$ are formed in master reticles 46A to 46H. These original patterns S17B to S24B are formed by etching of light shield film such as chromium (Cr) film. The original patterns of the master reticles 46A and 46B are respectively surrounded by light shield bands 56A and 56B made of chromium film, and alignment marks 64A and 64B are formed on outer sides of the light shield bands 56A and 56B. Similarly, other master reticles are also formed with the light shield bands and the alignment marks (not shown).

As a substrate of each of the master reticles 46A, 46B, . . . , quartz (e.g., synthetic quartz) can be used if the exposure light of the light exposing section 32 is KrF or ArF excimer laser or the lik . If the exposur light is $F_2$ laser light or the like, quartz in which fluorite or fluorine is mixed can be used as the substrate. Since the existing master reticles 46A, 47B, . . . , are repeatedly used, the pattern forming surface is provided with a pellicle comprising parallel flat plate of light transmission for preventing a foreign substance from attaching.

Figure 6:
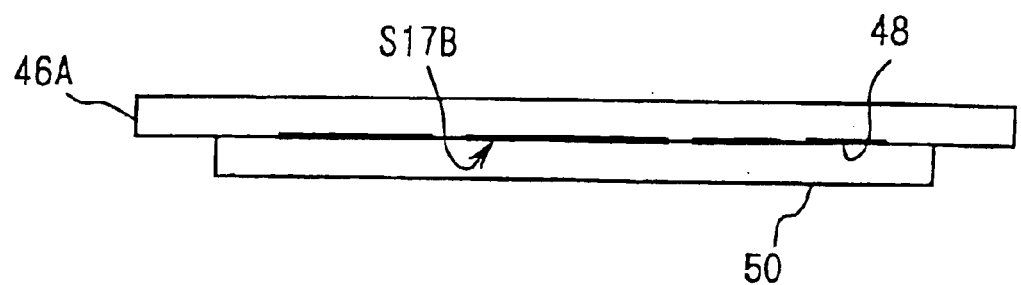
FIG. 6 is a side view showing the master reticle for the existing pattern.

FIG. 6 is a side view showing the master reticle 46A. In FIG.6, a pellicle 50 having predetermined thickness and refractive index is fixed such as to cover the original pattern S17B of the pattern region 48 of the master reticle 46A. Therefore, the projection optical system. PL of the light exposing section 32 commonly use the pattern surface of the master reticle 46A and the working reticle 43 while taking the thickness of the pellicle 50 into consideration.

Next, the procedure managing apparatus 40 generates new original patterns having the newly-forming pattern portions N1 to N8 and P1 to P3 which are enlarged with reciprocal (1/$\beta$) magnification (e.g., four times or five times) of the projection magnification p. In steps 103 to 110 in FIG. 8A, the master reticles in which these new original patterns are formed are produced. The procedure managing apparatus 40 resets a value of a parameter indicating order of the newly-forming pattern portions to 0 (step 103), checks whether the parameter "n" reach d N (step 104). When "n" did not reach N, the flow proceeds to step 105, and 1 is added to the value of the parameter "n".

Electron beam resist is applied to an n-th substrate of the fluorite or fluorine taken out from the substrate accommodating section 36 in the cotar developer sections (C/D section) 37. The substrate is transferred to the EB pattern-forming section 33 from the cotar developer sections 37 through the substrate transfer section 34 (step 106). A predetermined alignment mark is formed on the substrate. Design data of the original pattern having the M number of new patterns enlarged by the procedure managing apparatus 40 is supplied to the EB pattern-forming section 33. After the EB pattern-forming section 33 positions the pattern-forming position of the substrate using the alignment mark of the substrate (step 107), the EB pattern-forming section 33 directly forms the n-th original pattern on the substrate (step 108). Then, the substrate pattern-formed by the electron beam is transferred to the cotar developer sections 37, and the electron beam resist development is carried out (step 109). The exposure beam resist of the present embodiment has characteristics to absorb the exposure light (excimer laser light) used by the light exposing section 32. Therefore, resist pattern remained by the development can be used as an original pattern as it is. The n-th substrate after development is transferred to the reticle library of the light exposing section 32, as a master reticle for the n-th newly-forming pattern portion (step 110).

Figure 7A:
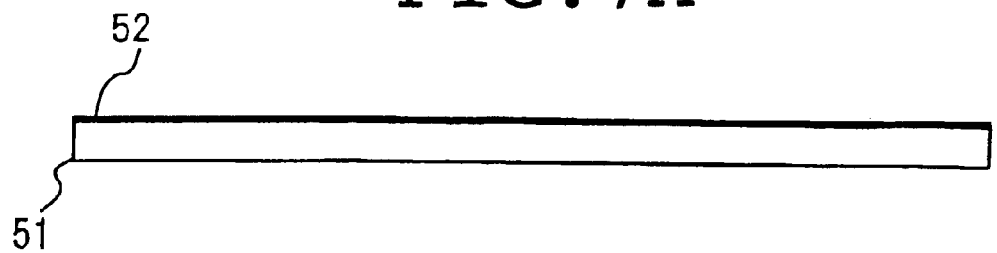
FIGS. 7A to 7C are diagrams showing a producing procedure of the master reticle for the newly-forming pattern portion.
Figure 7B:
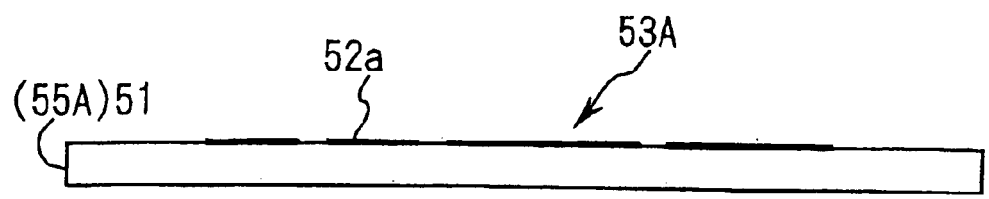
Figure 7C:
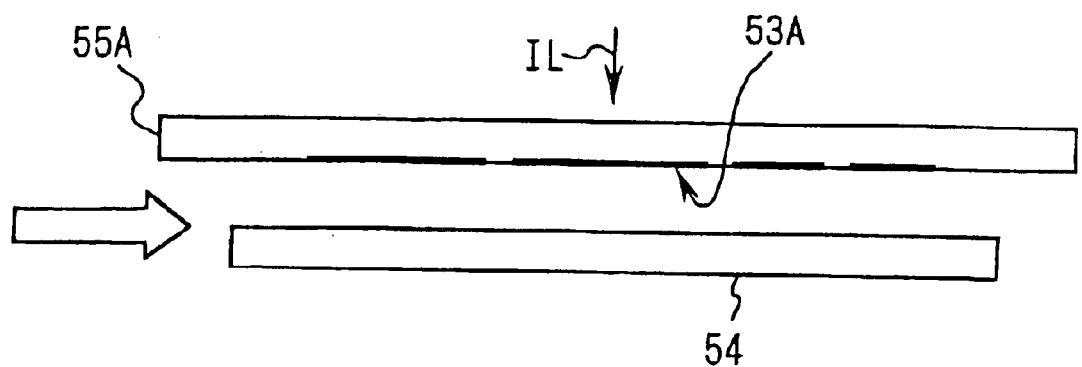

A producing procedure of the master reticle will be explained in detail with reference to FIGS. 7A to 7C. First, as shown in FIG. 7A, electron beam resist 52 is applied to a substrate 51, the original pattern is formed on the electron beam resist 52 under vacuum atmosphere in the EB pattern-forming section 33. Thereafter, it is developed, and when the electron beam resist is positives a resist pattern 52a of a region of a pattern region 53A that is not irradiated with exposure beam is left as the original pattern. In the present embodiment, a coloring matter absorbing exposure light (or reflective) used in the light exposing section 32 is included in the resist pattern 52a. Therefore, the substrate S1 can be used as the master reticle 55A without subjecting the substrate 51 to deposition of chromium film and etching. With this, there is merit that the master reticle can be produced in a short time at low producing cost.

In this case, since the master reticle 55A does not have the dust-proofing pellicle 50 which is mounted to master reticle 46A shown in FIG. 6, if the exposure is carried out by the projection exposure apparatus shown in FIG. 2, there is an adverse possibility that defocus is generated. In order to avoid this, when the master reticle 55A is placed on the reticle stage 17 shown in FIG. 2, it is desirable to dispose a focus correcting plate 54 having the same material and same thickness of those of the pellicle 50 between the projection optical system PL and the reticle stage 17 as shown in FIG. 7C. When the focus correcting plate 54 is not used, a position of the reticle stage 17 or the sample stage 21 in the Z direction may be corrected such that the defocus is compensated.

Figure 8A:
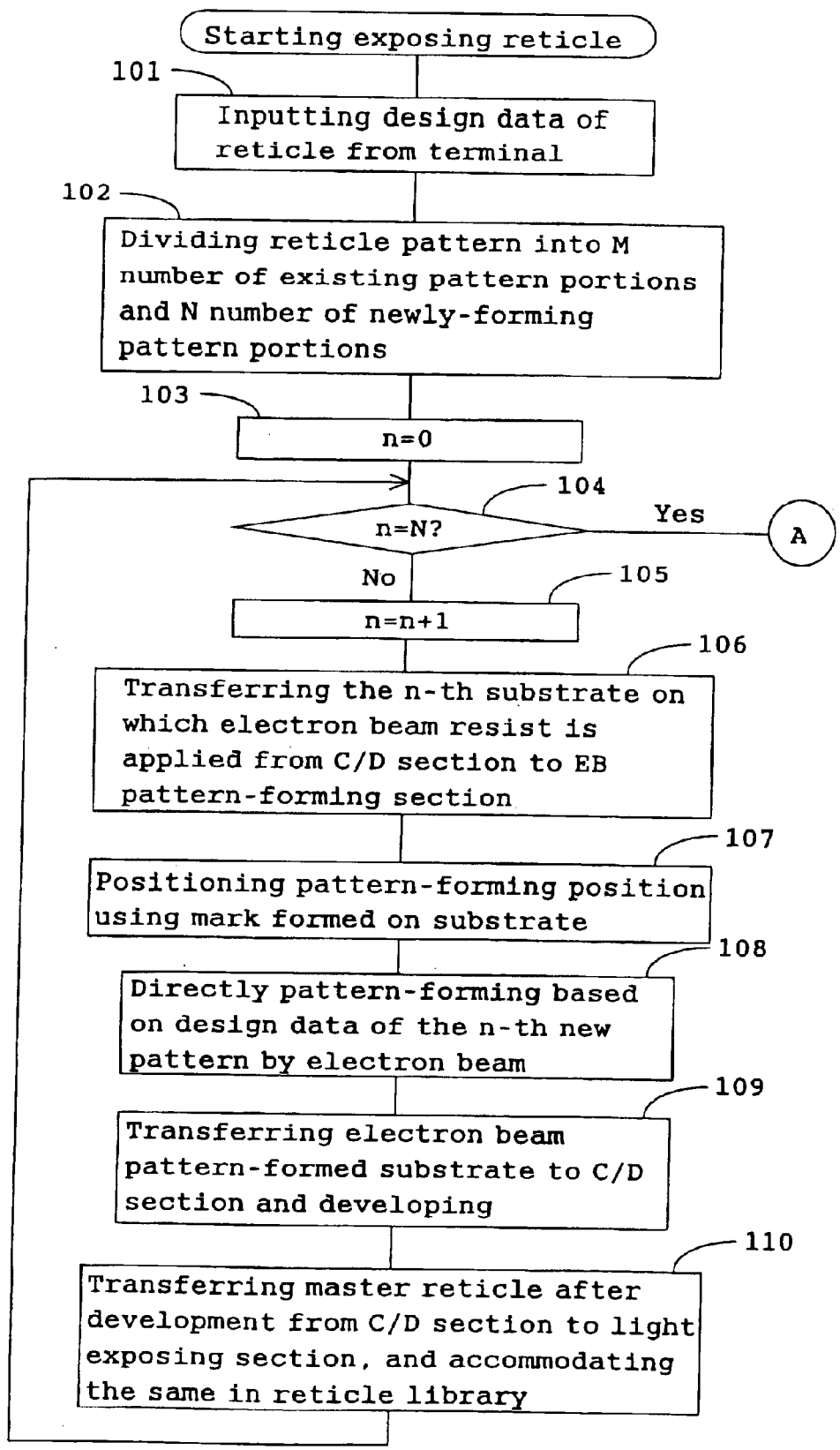
FIGS. 8A to 8C are flowcharts showing one example of operation from a designing procedure of the reticle to a producing procedure in the embodiment of the invention.
Figure 8B:
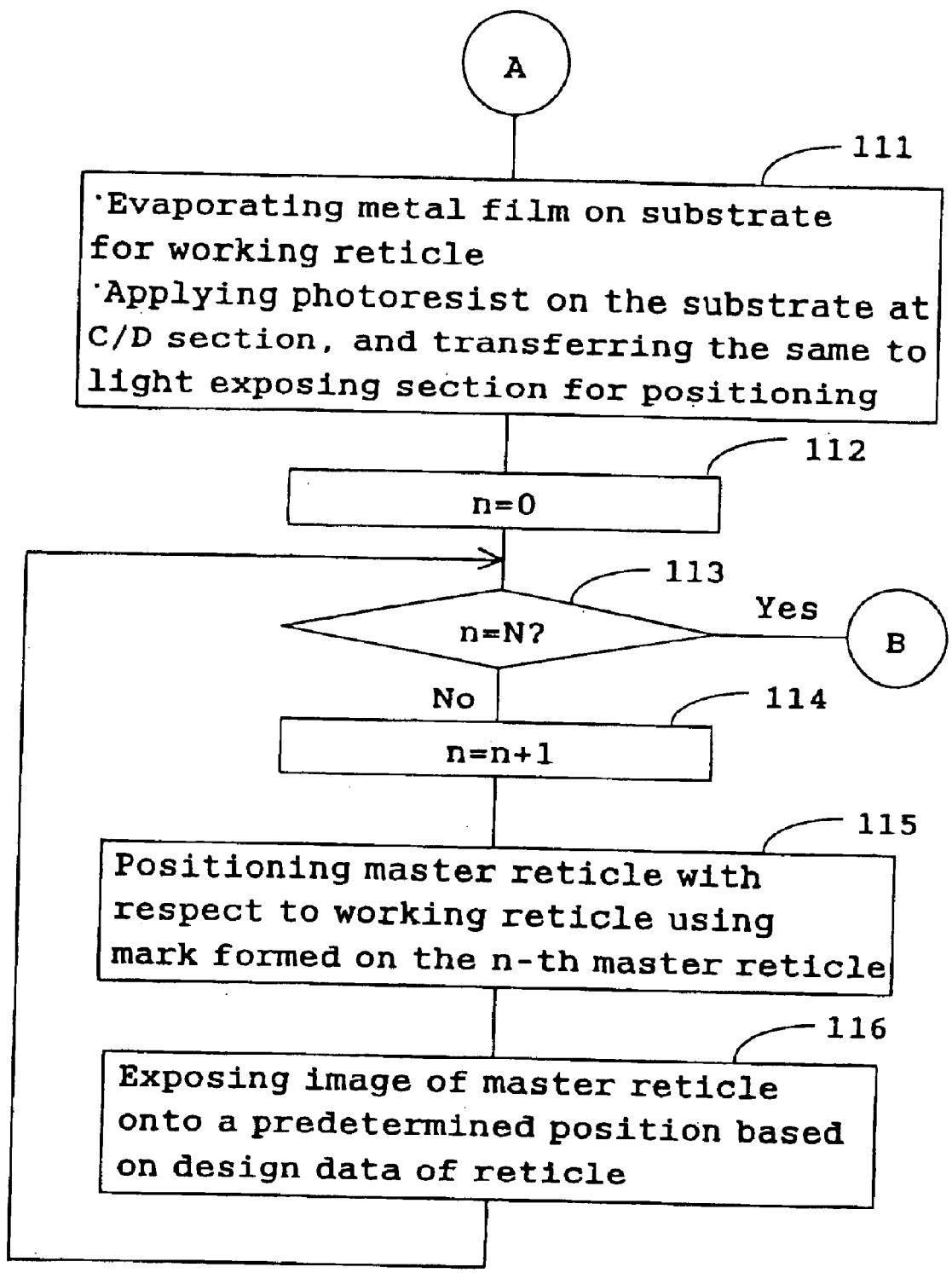

Returning to the flowchart in FIG. 8A, the N-number of master reticles corresponding to all the newly-forming pattern portions shown in FIG. 3A can be produced by repeating the steps 105 to 110 N times.

In this case, the original patterns of the newly-forming pattern portions N1 to N6 having relative large areas are respectively formed in one master reticle. However, the newly-forming pattern portions P1 to P8 having small wires, a plurality of original patterns are formed in one master reticle as shown in FIG. 5.

Figure 5:
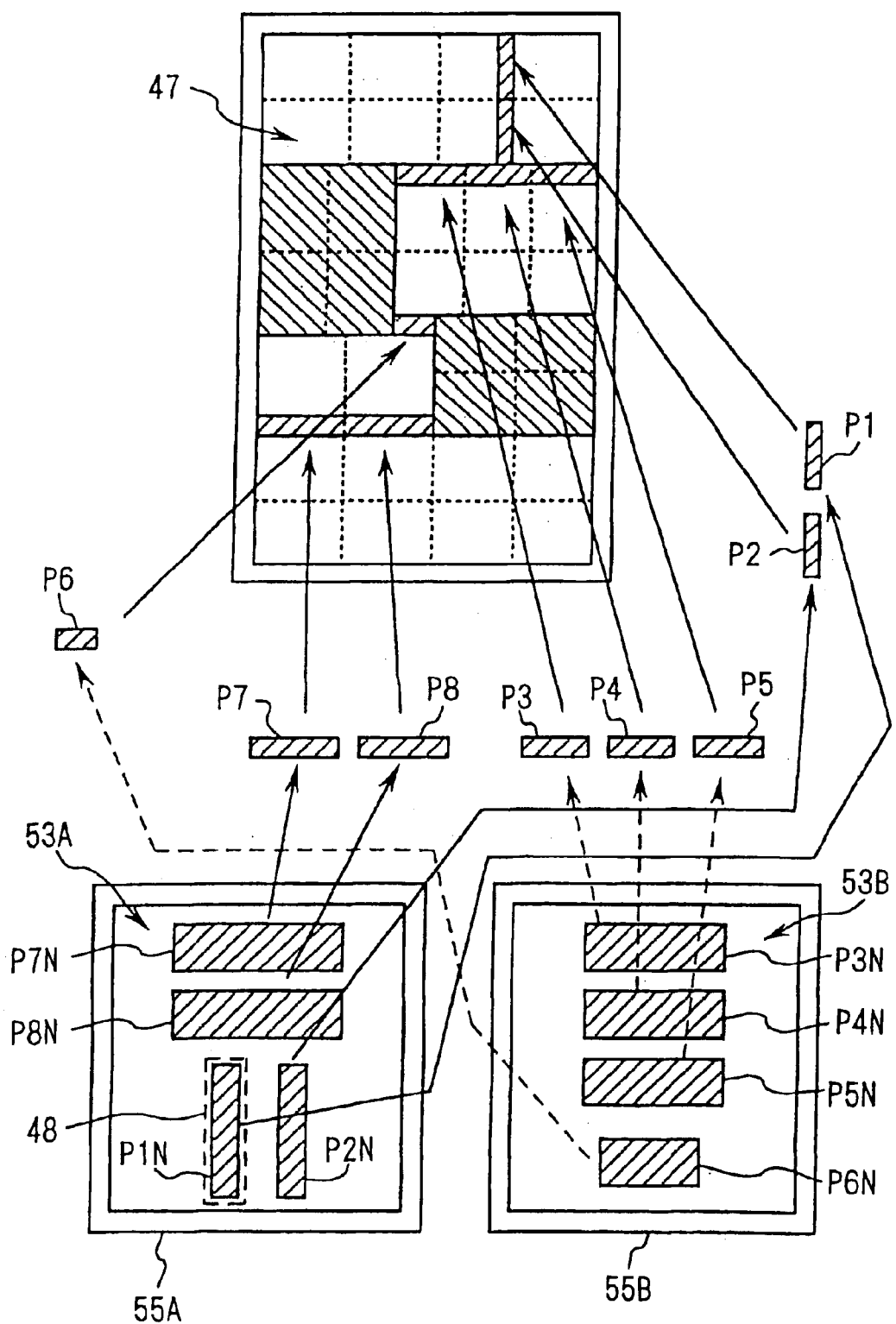
FIG. 5 is a diagram showing a master reticle corresponding to partial newly-forming pattern portion shown in FIG. 3A.

As shown in FIG. 5, the original patterns P1N, P2N, P7N, P8N having enlarged newly-forming pattern portions P1, P2, P7, P8 are formed in one master reticle 55A. The original patterns P3N to P6N having the newly-forming pattern portions P3 to P6 are also formed in the P53B of one master reticl 55B. When the plurality of original patterns are formed on the one master reticle 55A, 55B in this manner, only a desired original pattern is selected by visual field aperture at the time of exposure. For example, the original pattern P1N is exposed to light, a visual field 48 is set such that the visual field 48 is within a light shield band (not shown) the original pattern P1N using the movable blind of the illumination visual field aperture system 11 shown in FIG. 2 at the time of scanning and exposure, so that a pattern other than the visual field 48 is not exposed to light. Alignment marks (not shown) are formed also on outer side of the pattern regions of the master reticles 55A and 55B Next, in step 111 in FIG. 8B, the procedure managing apparatus 40 takes out a substrate (made of quartz in which fluorite or fluorine is mixed) for the working reticle 43 from the substrate accommodating section 36 shown in FIG. 1. A metal film such as chromium film is previously deposited on the substrate, and a mark for rough positioning is also formed. This positioning mark is not always necessary. The substrate is transferred to the cotar developer sections 37, and photoresist that is sensitive to the exposure light of the light exposing section 32 is applied to the substrate. Next, the substrate is transferred to the projection exposure apparatus shown in FIG. 2 thr ugh the substrate transfer section 34, a command to carry out the stitching exposure is sent to the main control apparatus 7 using the plurality master reticles.

Information concerning positional relation between the newly-forming pattern portion and the existing pattern portion in the pattern region 47 shown in FIG. 3A is also supplied to the main control apparatus 7.

In reply thereto, the main control apparatus 7 pre-aligns the substrate with respect to the outer shape reference by the substrate loader system and then, loads the substrate onto the sample stage 21 in the light exposing section 32. Then, positioning with respect to stage coordinate system (X, Y) is carried out using a positioning mark on the substrate and the alignment sensor 28 if necessary.

Next, the main control apparatus 7 resets the parameter n indicative of order of exposure of the N number of new master reticles to zero (step 112) and then, checks whether the parameter n reached N (step 113), adds 1 to the parameter n when the parameter n is smaller than N (step 114), and the flow proceeds to step 115. Then, the n-th master reticle is taken out from the reticle library and placed on the reticle stage 17. Thereafter, positioning of the master reticle with respect to the stage coordinate system (S, Y) and thus the substrat of the working reticl 43 using the alignment mark of the master reticle and the reticle alignment microscope (not shown).

Next, the flow proceeds to step 116, the main control apparatus 7 control the position of the sample stage 21 such that the exposure region on the substrate of the working reticle 43 becomes the designed exposure position of the n-th master reticle. Thereafter, the scanning and exposure are started, and a reduced image of the original pattern of the master reticle is exposed to light on the substrate. At that time, if the master reticle is master reticles 55A and 55B shown in FIG. 5, the visual field is switched in accordance with a pattern to be transferred, and the exposure is repeatedly carried out using one master reticle 55A, 55B. When the stitching exposure of the n-th new master reticle is completed in this manner, the flow proceeds to step 117 from step 113 shown in FIG. 8C, the main control apparatus 7 resets a parameter m indicative of exposure order of the M number of existing master reticles and then, checks whether the parameter m reached M (step 118), adds 1 to the parameter m when the parameter m is smaller than M (step 119), and the flow proceeds to step 120. The m-th existing master reticle is placed on the reticle stage 17 to carry out the positioning, and the reduced image of the master reticle is scanned and exposed to light at a designed position on the substrate in step 121.

If stitching exposure of all the master reticles is completed in this manner, the flow proceeds to step 122 from step 118, and the substrate of the working reticle 43 is transferred to the cotar developer sections 37 and developed. Thereafter, the developed substrate is transferred to an etching section (not shown), and remaining resist pattern is etched as a mask (step 123), Further, the resist is peeled off and the dust-proofing pellicle is fixed if necessary, thereby completing the working reticle 43 shown in FIG. 3A. Further, a necessary number of working reticle having the same pattern as that of the working reticle 43 can be produced in a short time only by repeating the steps 111 to 123.

In the above embodiment, the original pattern formed in the EB pattern-forming section 33 is rougher than the pattern of the working reticle 43, and the pattern to be formed is about ½ or less as compared with the pattern of the working reticle 43. Therefore, the pattern-forming time of the EB pattern-forming section 33 is largely reduced as compared with a case in which all the patterns of the working reticle 43 are directly formed. In generally, since a step and scan type projection exposure apparatus using a KrF or ArF excimer laser light source and corresponding to the minimum line width of about 150 to 180 nm can be us d as it is as the light exp sing section 32 (projection exposure apparatus), the number of production facilities to be newly prepared is small, the producing costs can be reduced, and the developing time of the reticle can largely be reduced.

A working reticle 43 to be produced is 9×9 inches for example, and the pattern is projected onto a wafer with reduction magnification such as ¼ or ⅕ by another projection exposure apparatus. The wafer is a disc-like substrate such as semiconductor device (silicon or the like) or SOI (silicon on insulator) for example. If the reduction magnification is set to ¼, and the minimum line width of the pattern image that is to be projected on the wafer finally is 180 to 100 nm, and the required precision of the line width is 5% the minimum line width of the pattern of the working reticle 43 is 720 to 400 nm, and the working precision is about 36 to 20 nm ($1.6\times10^{-7}$ to $0.8\times10^{-7}$) with respect to the entire length 230 mm. This precision can not be achieved easily even if attempt is made to directly form the pattern itself of the working reticle 43 by the electron beam drawing apparatus.

Whereas, in the present embodiment, the original pattern to be newly formed by the electron beam drawing apparatus (EB pattern-forming section 33) is an original pattern whose partial pattern of the working reticle 43 shown in FIG. 3A is enlarged four tim s or fiv times. When the projection image of the projection exposure apparatus in FIG. 2 is substantially ideal, if the pattern-forming precision of the current electron beam drawing apparatus is $2.4\times10^{-7}$ and the magnification of the original pattern is four times, the pattern-forming precision on the working reticle 43 is about $0.6\times10^{-7}$, and required precision can be obtained on the wafer. In the present embodiment, since the original pattern to be formed by the electron beam drawing apparatus is a pattern having a length equal to or less than ¼ of the pattern of the working reticle 43, a practical pattern-forming precision is further enhanced.

Although transparent working reticle 43 is to be produced in the above embodiment, it is possible to similarly produce a reflective reticle using a wafer such as silicon wafer as a substrate, and a mask (stencil mask) of a membrane structure using a wafer as a substrate. The reflective reticle is used in an exposure apparatus using extreme ultraviolet light (EUV light) as exposure beam for example, and the mask of membrane structure is used in an exposure beam exposure apparatus.

Figure 3B:
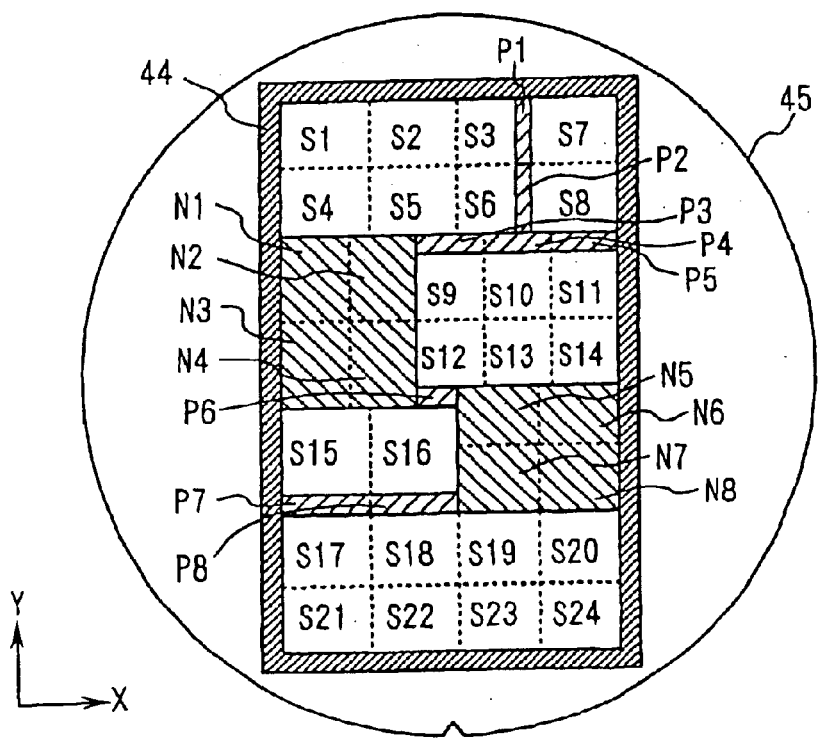
FIG. 3B is a plan view showing a reflective reticle 45 to be produced.

FIG. 3B shows a reflective reticle 45 having the same pattern as that of FIG. 3A. In FIG. 3B, a pattern region in a light shield band 44W (made of film absorbing EUV light) of the reticle 45 using a silicon wafer as a substrate is divided into existing pattern portions S1 to S24, newly-forming pattern portions N1 to N8 and newly-forming pattern portions P1 to P8. In this case, EUV light absorbing film, reflective film and resist are sequentially applied to the substrate, the reduced image of the master reticle which is the same as that in the above embodiment is exposed while stitching screens, and developing and pattern forming treatment are carried out, thereby producing the reflective reticle 45. A multi-layer comprising molybdenum (Mo) and silicon (Si) which are alternately laminated is used as the reflective film of EUV light when its wavelength is 13.4 nm, and a multi-layer comprising molybdenum (No) and beryllium (Be) is used as the reflective film when the wavelength is 11.5 nm.

It is considered that the minimum line width of the pattern to be produced by the exposure apparatus using EUV light for example is about 130 to 30 nm, and if the exposure apparatus uses reduced projection of about ¼, the required precision of the pattern on the reflective reticle 45 is about ($1.2\times10^{-7}$ to $0.2\times10^{-7}$). If an original pattern whose reticle 45 is enlarged four times for example is formed by the electron beam drawing apparatus and a length of the master reticle is set to the same as that of the reticle 45, the pattern-forming precision of about $0.6\times10^{-7}$ is obtained. Therefore, if the size of the master reticle is reduced to about ⅓ of the reticle 45, i.e., if the number of divisions of the pattern of the reticle 45 is increased, the pattern-forming precision of about $0.2\times10^{-7}$ is obtained.

Next, in the above embodiment, since the reduced images of the plurality of master reticle are exposed while stitching screens, an exposure method for reducing influence of stitching error at the boundary portion is used. The exposure method will be explained with reference to FIGS. 9A to 9C, 10A to 10C, 11A to 11C, 12A to 12C, and 13A to 13C. Here, the explanation will be made based on a case in which the reduced images of the patterns of the two master reticles 46A and 46B are stitched and exposed and then, development, etching and the like are carried out and finally, a plurality linear patterns 59 comprising metal films each having a predetermined line width (L1+L2) are formed as shown in FIG. 10C. The linear pattern 59 actually has the same shape as that of the inversed reduced image of the original pattern of the master reticle, but it is supposed that the reduction magnification is one time (with a magnification ratio of 1:1) and an erect image is projected for simplification.

Figure 9A:
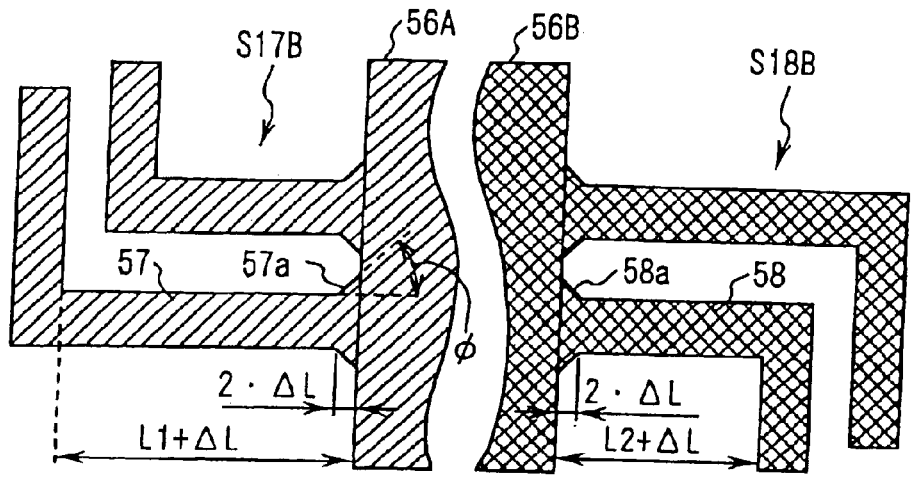
FIGS. 9A to 9C are explanatory diagrams when exposure is carried out while stitching screens in the embodiment.

FIG. 9A shows original pattern S17 and S8 to be formed on the master reticles 46A and 46B in corresponding to the linear pattern 59. In FIG. 9A, a first patt rn 57 comprising flight shield film having a predetermined width (the same as that of the linear pattern 59) and a length of (L1+ΔL) as a portion of the original pattern S17B is formed, and the first pattern 57 is connected to the light shield band 56A. An overlapping portion 57a of length 2×ΔL on the side of the light shield band 56A of the first pattern 57 is gradually spreading at angle φ. The optimal range, of the angle φ is 30 to 60°, and in the present embodiment, one example thereof is set to about 45°. The overlapping portion 57a may gradually spread toward the boundary stepwisely.

The width ΔL is set to about expected maximum value of a positional deviation amount of adjacent projection images when the stitching exposure is carried out. Similarly, a portion of the other original pattern S18B is formed with a second pattern 58 comprising light shield film having a predetermined width and a length of (L2+ΔL) connected to the light shield band 56B. A overlapping portion 58a having a length of 2×ΔL spreading at angle φ is also formed on the side of the light shield band 56B of the second pattern 58. That is, a total of length of the patterns 57 and 58 (L1+L2+L+2×ΔL) is formed longer than a length (L1+L2) of the linear pattern 59 by 2×ΔL.

Figure 9B:
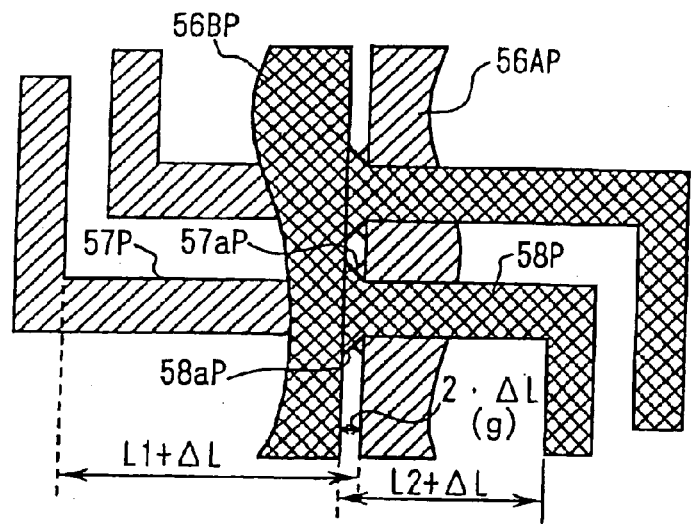

Next, if the reduced images of the original patterns S17B and S18B are sequentially connected and exposed to light, as shown in FIG. 9B, an image 56AP of the light shield band 56A and an image 57P of the first pattern 57 are exposed to light, and an image 56BP of the light shield band 56B and an image 58P of the second pattern 58 are exposed to light. At that time, if there is no positional deviation. The first pattern 57P and the second pattern 58P are overlapped at portions of the overlapped images 57aP and 58aP of width of 2×ΔL, and the first pattern 57P and the second pattern 58P are projected on the same straight line.

Figure 9C:
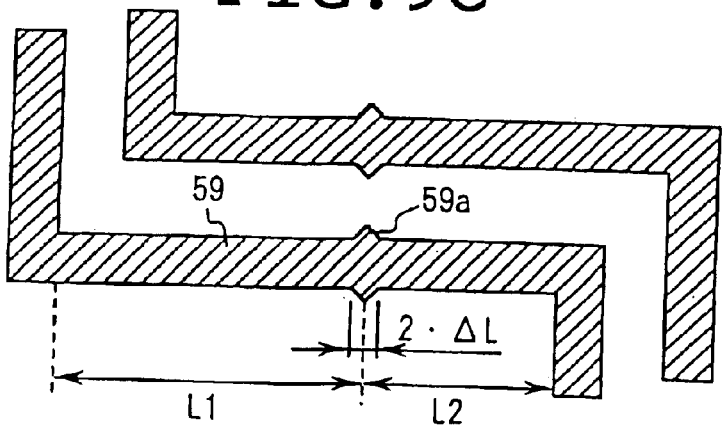

If the photoresist is developed after it is exposed to light of normal exposure light amount, the linear pattern 59 having a boundary 59a of length (L1+L2) and width of 2×ΔL is left as a resist pattern as shown in FIG. 9C. A central portion of the boundary 59a is thick and of angle shape. If the resist pattern is etched as a mask, the linear pattern 59 becomes a metal film pattern of the same shape. According to the normal exposure light amount, the boundary 59a is remained. To solve this problem, the exposure light amount is increased to carry out the over exposure. The boundary 59a is originally extremely small when it was designed, and in reality, the boundary 59a becomes smaller by exposure light that wraps around. Further, the boundary 59a can be made smaller by optimizing angles φ of the overlapping portions 57a and 58a. When ther is no influenc v n if the boundary 59a is remained due to characteristics of device, the normal exposure light amount may be used.

Figure 10A:
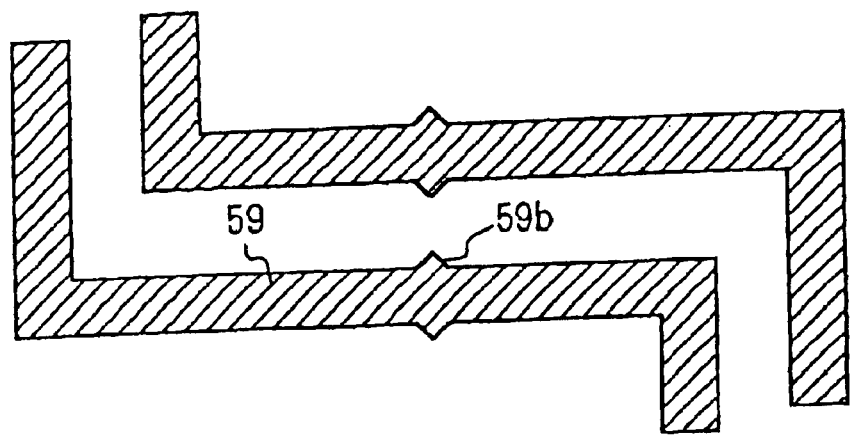
FIGS. 10A to 10C are diagrams showing shape of linear pattern obtained when over exposure is carried out while exposure light amount is increased gradually in the example shown in FIGS. 9A to 9C.
Figure 10B:
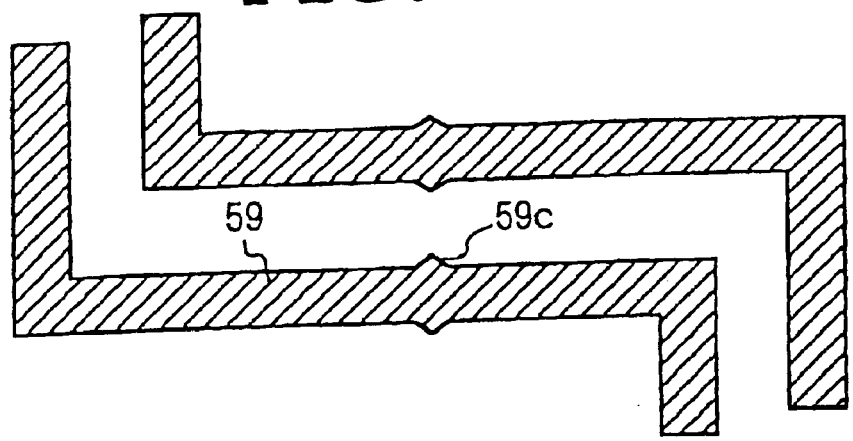
Figure 10C:
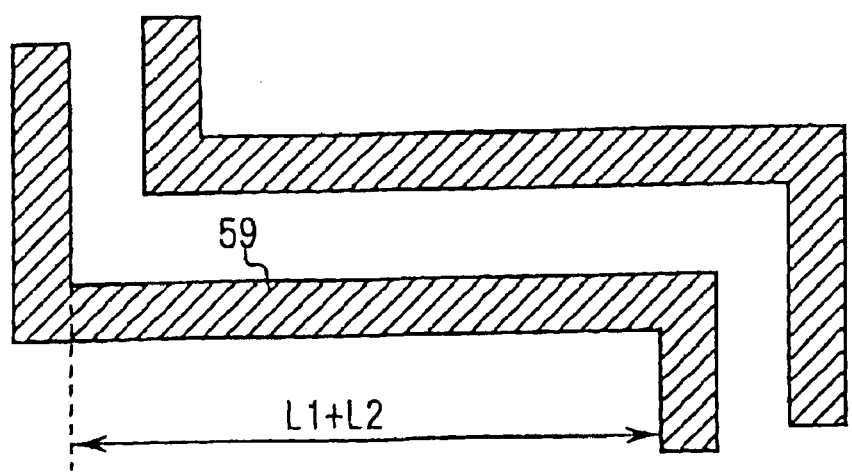

FIGS. 10A to 10C show the linear pattern 59 made of metal film obtained finally when the stitching exposure shown in FIG. 9B is carried out with over exposure. If the exposure light amount is increased slightly, a boundary portion 59b becomes slightly smaller as shown in FIG. 10A, and if the exposure light amount is further increased, a boundary portion 59c becomes further smaller as shown in FIG. 10B, and if the exposure light amount is reduced by a predetermined amount, a boundary portion whose line width is varied does not exist. Therefore, it is recommended to previously obtain such an exposure light amount that the boundary portion does not exist by test printing or the like. With this method, even if the stitching exposure is carried out, the line width is not varied halfway, and performance of the device in enhanced.

With the over exposure, a line width of not only the boundary portion 59c, but also of the liner pattern 59 becomes thin in some cases. To avoid this problem, the line width of the linear pattern 59 on the master reticle is made thicker than a designed value while taking the over exposure light amount into consideration.

Figure 11A:
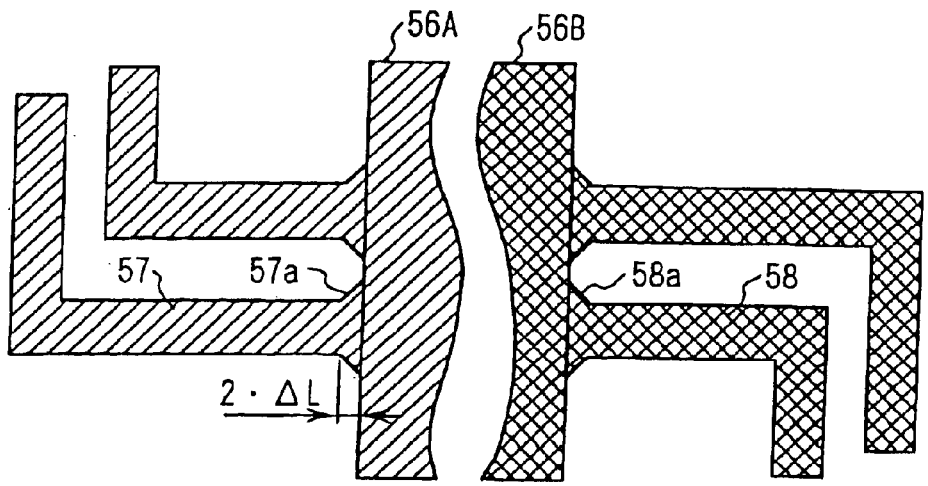
FIGS. 11A to 11C are diagrams showing influenc of lateral deviation at the time of stitching exposure in the example shown in FIGS. 9A to 9C.
Figure 11B:
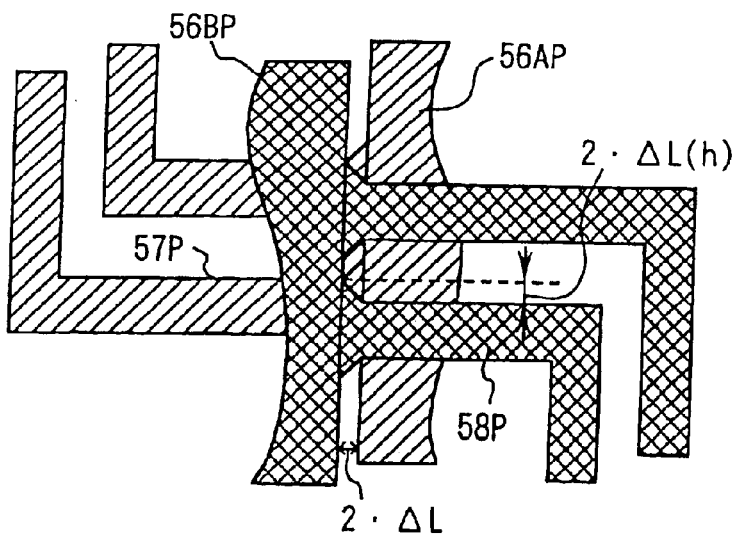
Figure 11C:
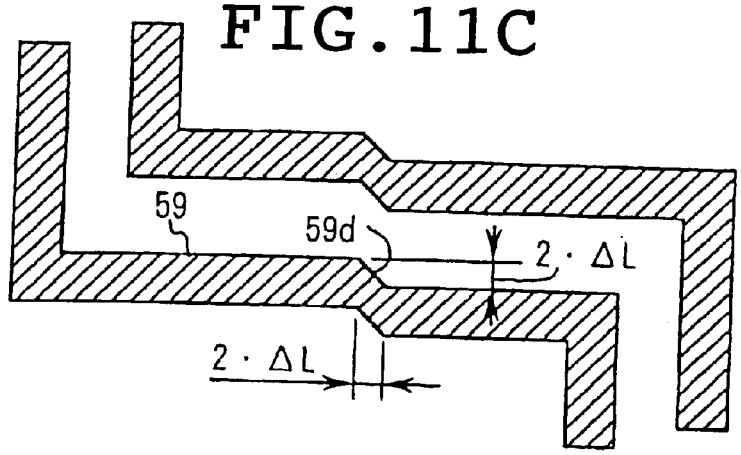

Influence of positional deviation on the boundary portion when the stitching xposur is carried out will be explained. FIG. 11A shows the same original patterns S17B and 118B as those of FIG. 9A. FIG. 11B shows the second pattern image 58P deviated laterally by 2×ΔL. In this case also, the linear pattern 59 that is remained after the development and pattern formation is brought into a state in which the boundary portion 59d of length of 2×ΔL is bent, the line width is not varied almost at all and thus, the performance of the device is not varied almost at all. Therefore, the lateral deviation amount h of the second pattern 58P with respect to the first pattern 57P is permitted up to about ±2×ΔL.

Further, in FIG. 9B, even if a length g of the overlapping portion between the first pattern 57P and the second pattern 58P is varied within a range of ±2×ΔL or less, since the shape of the boundary portion 59a of the obtained linear pattern 59 is not varied almost at all, tolerance range of the positional deviation amount in the longitudinal direction is about ±2×ΔL.

Figure 12A:
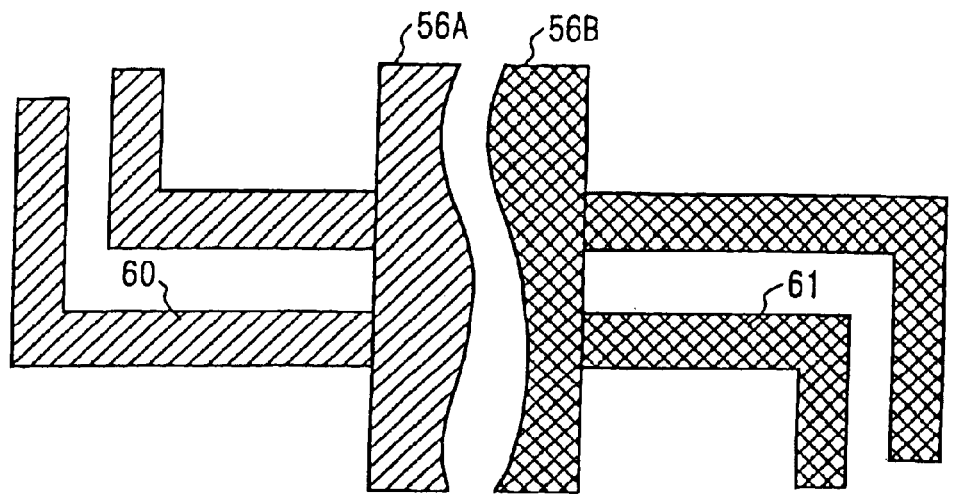
FIGS. 12A to 12C are diagrams showing variation in shape of the linear pattern obtained when the lateral deviation is generted.
Figure 12B:
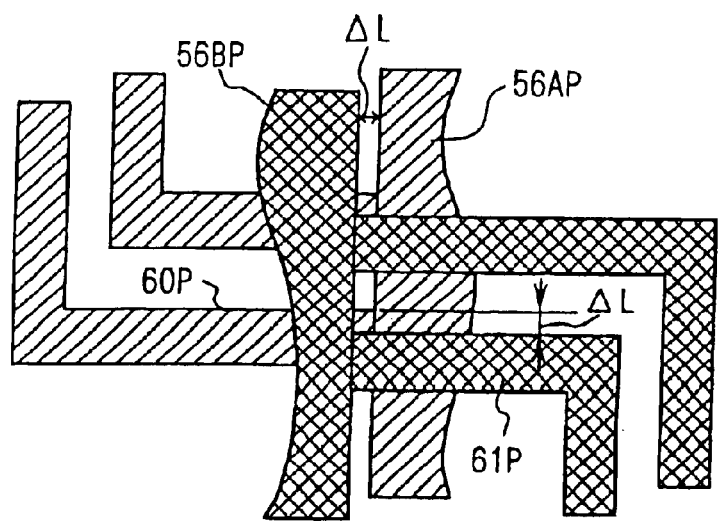
Figure 12C:
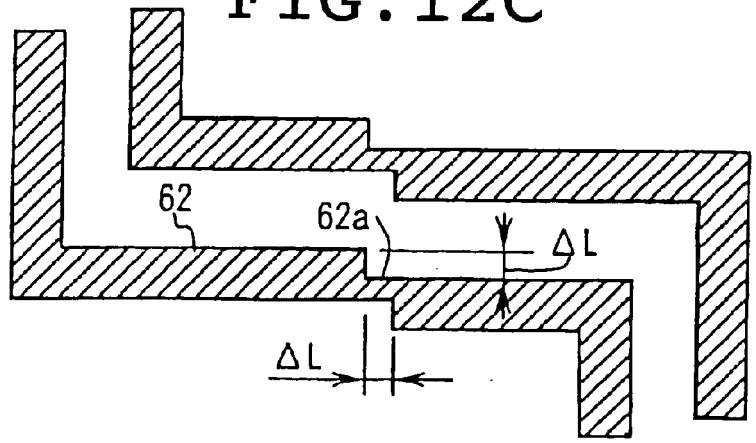

In order to compared with the above embodiment, an example of a linear pattern 62 obtained by stitching and exposing a pattern having no overlapping portion is shown in FIGS. 12A to 12C and FIGS. 13A to 13C. That is, as shown in FIG. 12A, if the linear patterns 60 and 61 are overlapped on the light shield bands 56A and 56B by a length of ΔL and sequentially exposed to light, the patt rn images 60P and 61P are exposed as shown in FIG. 12B. If the image 61P is laterally deviated by ΔL at that time, in the linear pattern 62 obtained after the development and the like, a width of the boundary portion 62a of the length ΔL is narrowed by ΔL as shown in FIG. 12C, and there is an adverse possibility that the operation speed of the device is affected.

Figure 13A:
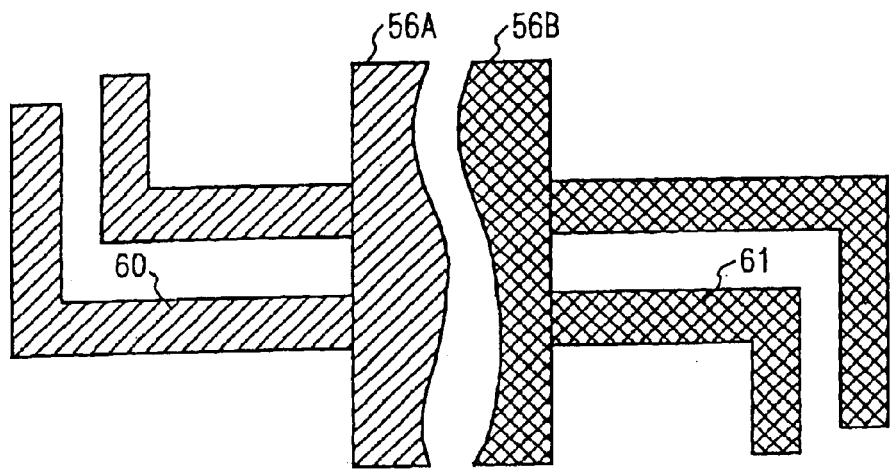
FIGS. 13A to 13C are diagrams showing variation in shape when positional deviation of the linear pattern is generated in its longitudinal direction.
Figure 13B:
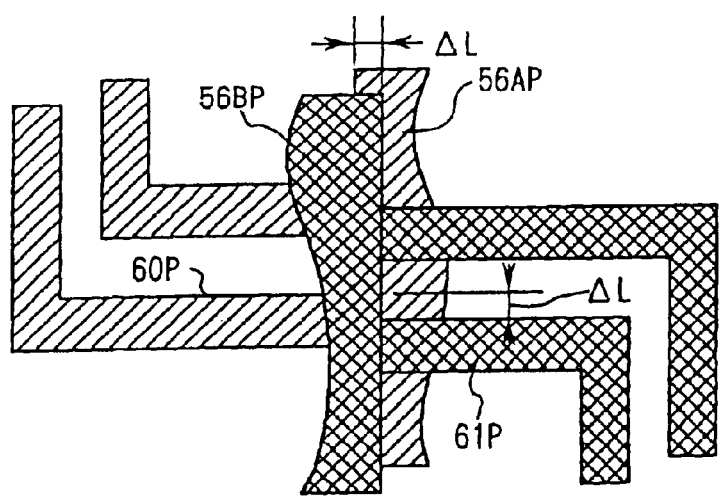
Figure 13C:
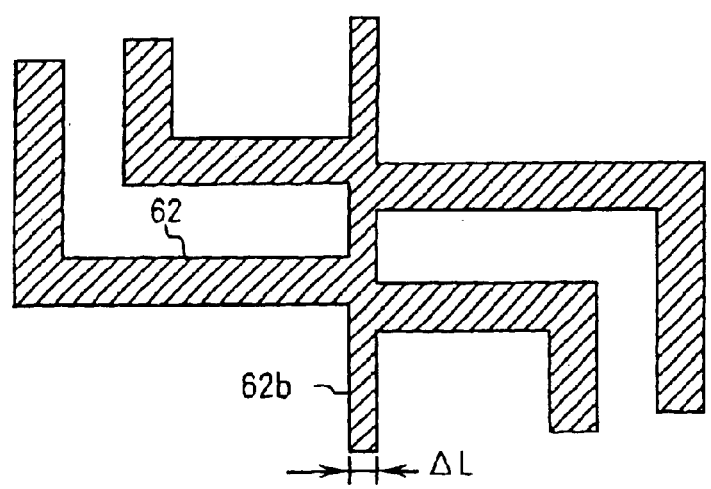

Further, as shown in FIG. 13B, after the linear patterns 61 and 61 shown in FIG. 13A are sequentially exposed such that the light shield bands 56A and 56B are overlapped by the length ΔL, the linear pattern 62 obtained by being developed is short circuited at the boundary portion 62b of the length ΔL. In such a state, the device can not operate normally. Therefore, when the tip end is not provided with a thick overlapping portion, if a positional deviation exceeding ΔL is generated in the longitudinal direction, the short circuit is generated, but in the above embodiment, tolerance of the positional deviation amount in the longitudinal direction is increased.

Conventionally, a technique for splicing portions are made semi-transparent and overlapped with each other is used. However, according to such a technique, there is an adverse possibility that the uneven exposure light amount is generated in a semi-transparent portion, and it is necessary to take influence of a foreign substance attached to the semi-transparent portion into consideration. However, according to the present embodiment, such an adverse influence need not be taken into account.

Although the excimer laser light source 2, and the light exposing section 32 are step and scan type projection exposure apparatuses in the above embodiment, as the projection exposure apparatus, a blanket type (stepper type) projection exposure apparatus may be used.

In the EB pattern-forming section 33 in FIG. 1, the electron beam drawing apparatus for directly forming image using exposure beam is used, a cell projection type electron beam drawing apparatus for forming a pattern with exposure beam of a predetermined shape maybe used. In this case, there is merit that the producing time of a master reticle to be newly prepared is shortened, and the producing time of the working reticle is also shortened correspondingly. The above embodiment provide the reticle producing system 41 integrally provided with the EB pattern-forming section 33, the light exposing section 32 and the cotar developer sections 37. Instead of it, a system for connecting, through a transfer mechanism, the EB pattern-forming section 33, the light exposing section 32 and the cotar developer sections 37 which are independently operated.

Figure 8C:
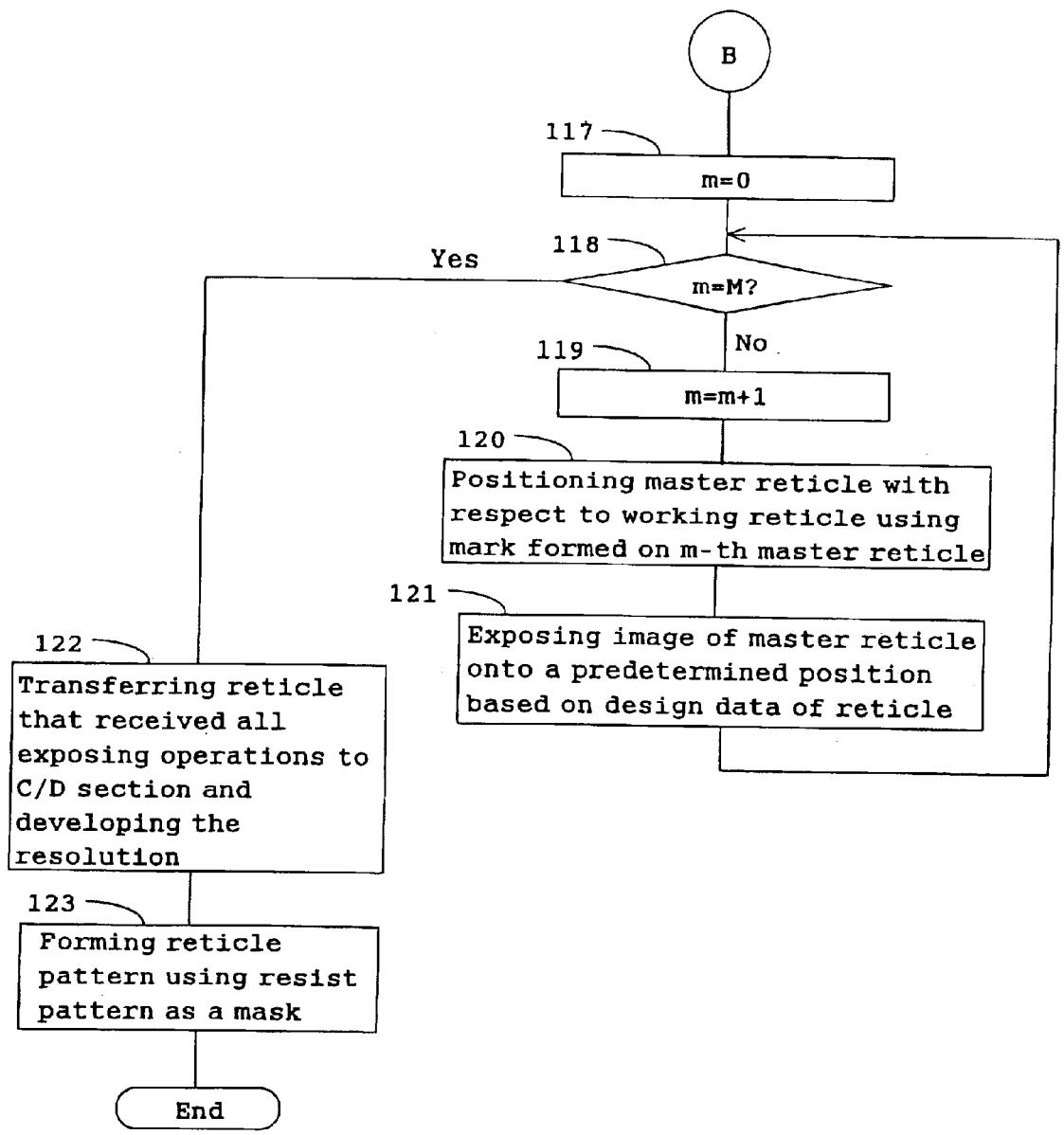

The above embodiment up to FIG. 8C is based on a premise of stitching exposur , but a circuit patt rn to b formed on the working reticle may be divided into function block units (i.e., a CPU, a DRAM, a SRAM, a D/A converter, an A/D converter or the like), the stitching portion between adjacent patterns may be eliminated, or the number of stitching portions may be reduced. Not only in the above embodiment, but also in the following embodiments, a resist having color agent may be used to produce a master reticle without carrying out etching, and this master reticle may be used, or a conventional master reticle may be used.

Next, a second embodiment of the invention will be explained with reference to FIGS. 14 to 18B. In the present embodiment, the invention is applied to a case in which one working reticle in which an enlarged pattern of a layer of a semiconductor device is formed is produced by exposing, on a predetermined substrate, images of patterns of a plurality of master reticles using a stepper type (blanket type) projection exposure apparatus while stitching screens.

Figure 14:
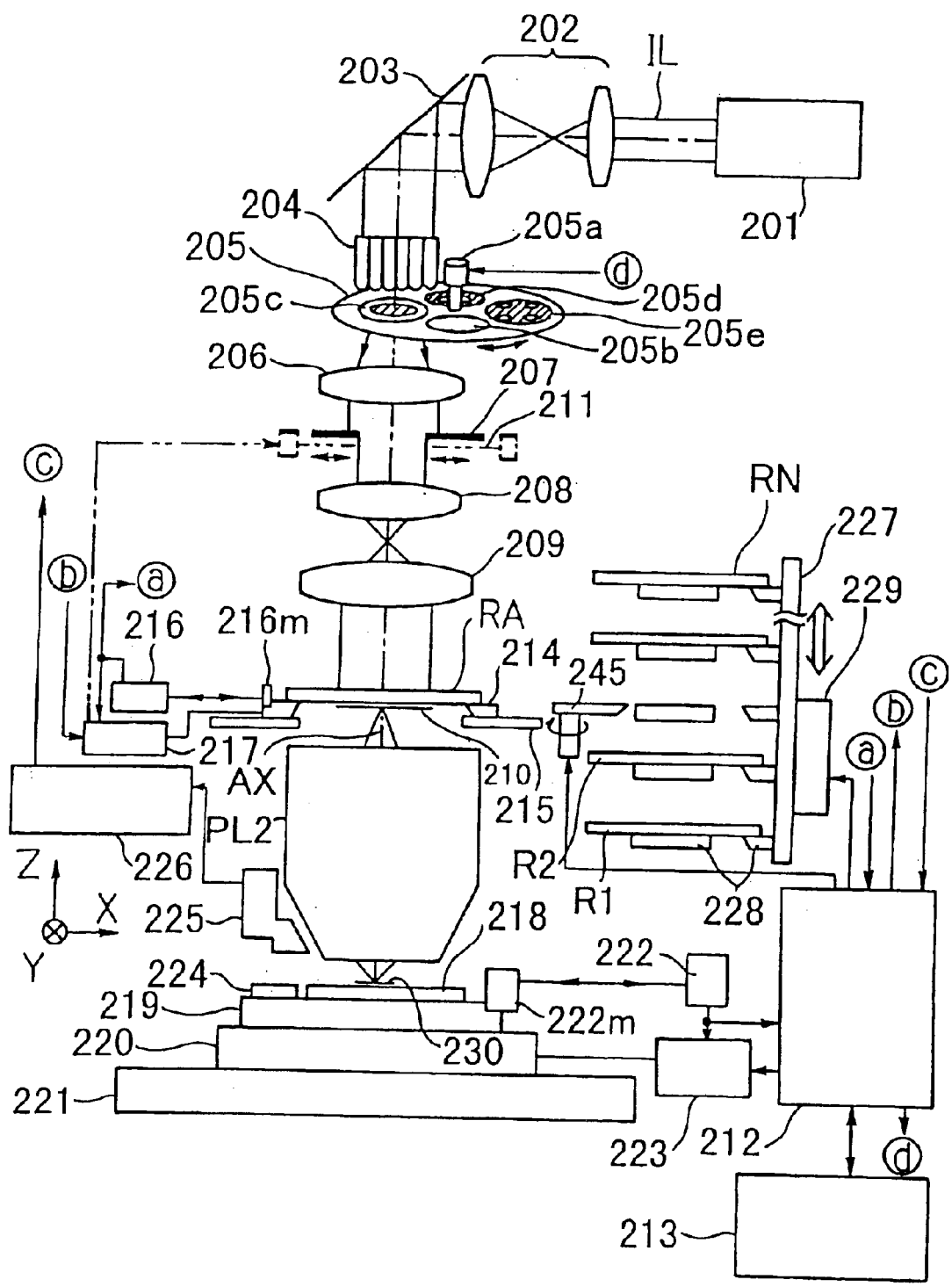
FIG. 14 is a block diagram showing a projection exposure apparatus used in a second embodiment of the invention.

FIG. 14 shows a projection exposure apparatus used in the present embodiment. In FIG. 14, as an exposure light source 201, an ArF excimer laser (oscillation wavelength is 193 nm) having a half-width of oscillation spectrum of about 1 pm or less is used. Another laser light source such as a KrF excimer laser (wavelength is 248 nm) or an $F_2$ laser (wavelength is 157 nm) may be used as the exposure light source 201, or solid laser such as YAG laser or an emission line lamp such as mercury lamp may be used.

Illumination light IL for exposure emitted from the exposure light source 201 passes through a beam shaping optical system 202 and a vibrating mirror 203 for preventing speckle, and enters a fly eye lens 204 as an optical integrator (homogenizer). An aperture variable plate 205 (corresponding to switching revolver 5) of an illumination system is rotatably disposed on an ejection surface of the fly eye lens 204 by a driving motor 205a. A circle opening aperture 205b for normal illumination a band-like opening aperture 205c for band-like illumination, a small circle opening aperture 205d for small coherence factor ($\alpha$ value) and an opening aperture 205e for deformation illumination comprising a plurality eccentric small openings are disposed around a rotation shaft of the aperture variable plate 205. More illumination opening aperture ($\alpha$ aperture) may be provided if necessary. A main control system 212 for controlling the operation of the entire apparatus rotates the aperture variable plate 205 through the driving motor 205a to dispose the predetermined illumination opening aperture on the ejection surface of the fly eye lens, 204 so that necessary illumination condition can be set.

The illumination light IL that passed the illumination system opening aperture of the ejection surface of the fly eye lens 204 illuminates a reticle blind (variable visual field aperture) 207 through a relay lens 206. The reticle blind 207 includes four movable blades as one example, a position and a size of a rectangular opening surrounded by these movable blades can be varied under control of the main control system 212. However, the position and the size thereof are constant when one wafer is exposed to light. The illumination light IL that passed the opening of the reticle blind 207 passed through a relay lens 208 and a condensor lens 209, and illuminates a rectangular (square in the present embodiment) illumination region 210 as a visual field of a pattern surface (lower surface) of a reticle to be exposed (master reticle RA in the present embodiment). The disposing surface of the reticle blind 207 is conjugate with the pattern surface, and a position and a size of the illumination region 210 are defined by an opening of the reticle blind 207.

A pattern in the illumination region 210 of the master reticle RA is reduced in size and projected on an exposure light region 230 on a glass substrate 218 on which photoresist to be exposed is applied with a predetermined projection magnification $\beta$ ($\beta$ is ¼, ⅕ or the like) through a projection optical system PL2. The projection optical system PL2 is a refractive system. When vacuum ultraviolet region light having a wavelength of about 200 nm or less such as the ArF excimer laser light is used, it is preferable that the projection optical system PL2 is a catadioptric system in order to reduce the chromatic aberration because there is few glass material having excellent transmittancy. In the following explanation, the Z axis is in parallel to an optical axis AX of the projection optical system PL2, the X axis is in parallel to the paper sheet of FIG. 14 within a plane intersecting with the Z axis, and the Y axis is perpendicular to the paper sheet of FIG. 14.

The master reticle RA is held on a reticle stage 214. The reticle stage 214 is disposed on a reticle base 215 such that the master reticle RA can move within a predetermined range in the X direction, the Y direction and the rotation direction by a linear motor. A moving mirror 16m fixed to the reticle stage 214 is irradiated with triaxial laser beam for example by means of a laser interferometer 216, and the X coordinate, the Y coordinate and the rotation angle of the reticle stage 214 are measured by the laser interferometer 216. These measured values are supplied to the main control system 212 and a reticle state driving system 217. The reticle state driving system 217 controls the moving speed and the position of the reticle stage 214 based on the control information from the measured value and the main control system 212.

On the other hand, the glass substrate 218 is absorbed and held on a substrate holder (not shown), the substrate holder is fixed on a sample stage 219, and, the sample stage 219 is fixed on a wafer stage 220. The wafer stage 220 continuously moves the sample stage 219 on a wafer base 221 in the X direction and the Y direction, and stepwisely moves the sample stage 219 in the X direction and the Y direction. The projection exposure apparatus of the present embodiment can hold a wafer, such as a silicon wafer and expose reduced images of reticle patterns on shoot regions. When the wafer is exposed, a substrate holder (not shown) on the sample stage 219 is replaced by a wafer holder.

In the wafer stage 220, a Z stage mechanism for controlling a position of the sample stage 219 in the Z direction (focus position) and an inclination angle is also incorporated. A defocus amount from an image surface in a plurality of measurement points of a surface of the glass substrate 218 is measured by an oblique-incidence type autofocus sensor (not shown) disposed on a side surface of the projection optical system PL2. At the time of exposure, the focus position and the inclination angle of the glass substrate 218 are controlled in an autofocus manner such that the defocus amount comes within the tolerance.

A moving mirror 22m fixed on a side surface of the sample stage 219 is irradiated with triaxial laser beam from an external laser interferometer 222, the laser interferometer 222 measures the x coordinate, the Y coordinate and the rotation angle of the sample stage 219 (glass substrate 218), and the measured values are supplied to a wafer driving system 223 and the main control system 212. The wafer driving system 223 drives the wafer stage 220 in the X direction and the Y direction based on the measured value of the laser interferometer 222, and the control information from the main control system 212. Design data of the working reticle to be produced and the like are stored in an exposure data file 213 connected to the main control system 212.

At the time of exposure, the master reticle on the reticle, stage 214 is replaced, the wafer stage 220 is stepwisely moved to position the glass substrate 218 and then, the reduced image of the pattern of the replaced master reticle is exposed to light on the glass substrate 218. This operation is repeated in a step and repeat manner, and one image as a whole of a pattern of one reticle is transferred on the glass substrate 218. In the present embodiment, as will be explained later, since a boundary region of images of patterns of adjacent master reticles are exposed to light twice, the reticle stage 214 and the wafer stag 220 are moved synchronously in each the exposure operation.

Figure 16:
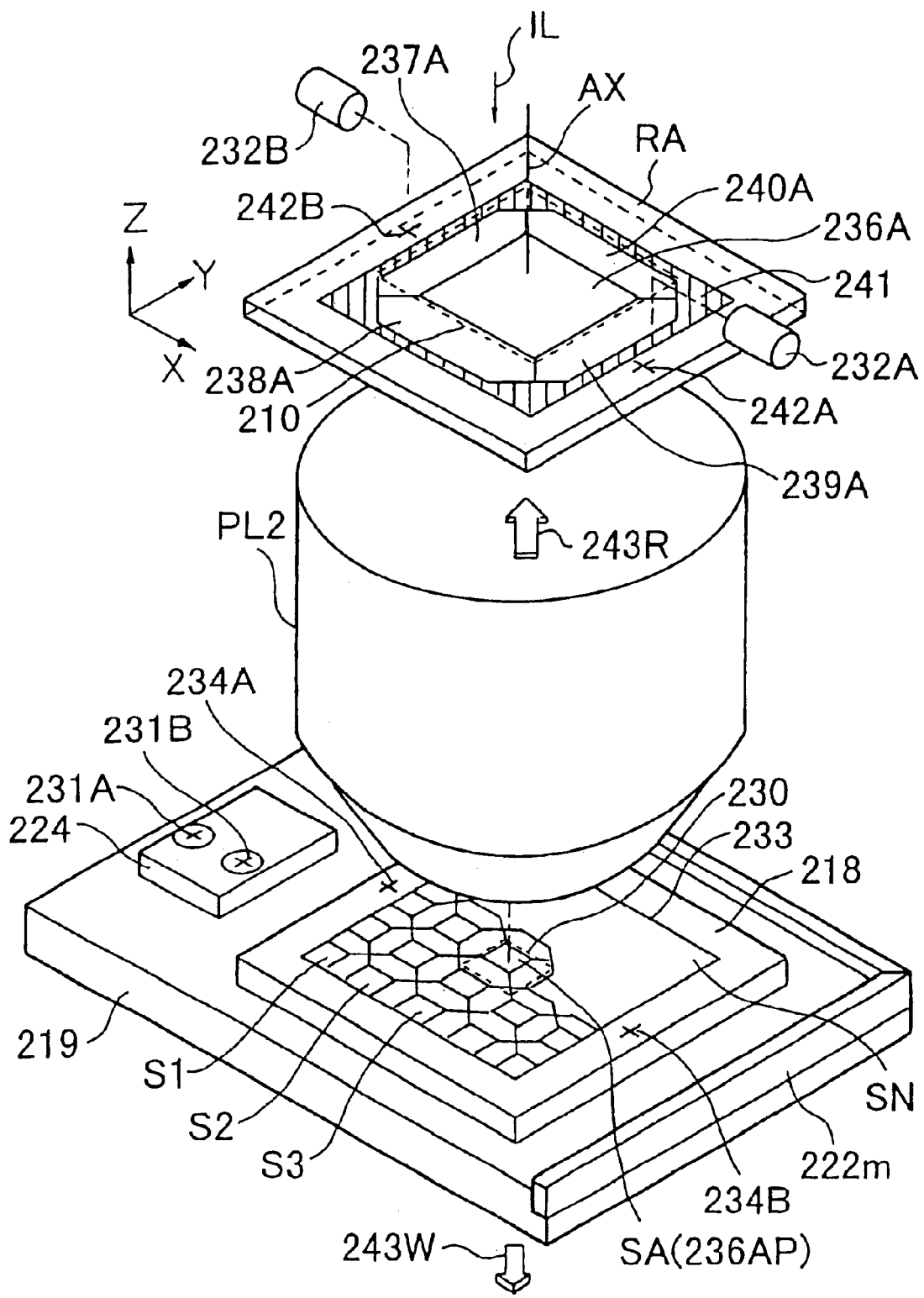
FIG. 16 is a perspective view of an essential portion used for explanation when an image of a pattern of the master reticle RA is projected onto a glass substrate 218 using the projection exposure apparatus shown in FIG. 14.

Before such an exposure is carried out, it is necessary to align the master reticle and the glass substrate 218 with high precision. For this purpose, a reference mark member 224 (corresponds to the reference mark member FM in FIG. 1) is fixed to the sample stage 219 in the vicinity of the glass substrate 218. As shown in FIG. 16, two-dimensional reference marks 231A and 231B are formed on the reference mark member 224. In FIG. 16, a pair of image processing type reticle alignment microscopes ("RA microscopes" herein after) 232A and 232B are disposed above the master reticle RA at a predetermined distance from each other in the X direction. The RA microscopes 232A and 232B picks up images of the alignment marks 242A and 242B on the master reticle RA using illumination light having the same wavelength as that of the illumination light IL through a mirror (not shown) and at the same time, picks up images of reference marks 231A and 231B on the reference mark member 224 through the projection optical system PL2. Image signals of the RA microscopes 232A and 232B are supplied to an alignment signal processing system 226 in FIG. 14, the alignment signal processing system 226 calculates positional deviation amounts of the alignment marks 242A and 242B with respect to the images of the reference marks 231A and 231B, and the positional d viation amounts are supplied to the main control system 212.

In FIG. 14, an image processing type alignment sensor 225 for detecting positions of the predetermined alignment marks 234A and 2348 (see FIG. 15A) on the glass substrate 218 is disposed on the side surface of the projection optical system PL2. An image signal of the alignment sensor 225 is also supplied to the alignment signal processing system 226. The alignment signal processing system 226 processes the image signal and detects a positional deviation amount of the alignment mark with respect to a predetermined detection center, and supplies the positional deviation amount to the main control system 212. A reference mark (not shown) for the alignment sensor 225 is formed on the reference mark member 224. Using the reference mark, a distance (base line amount) between a center (exposure center) of the pattern image of the master reticle to be exposed and the detection center of the alignment sensor 225 is previously obtained, and is stored in the exposure data file 213. When exposure for producing the working reticle is carried out as in the present embodiment, the alignment sensor 225 is not always necessary.

By exposing the reduced images of patterns of the plurality of master reticles while stitching screens, an image of one reticle pattern as a whole is transferred onto the glass substrate 218, and one working reticle is produc d. For this purpose, a reticle library 227 is disposed on a side surface of the reticle stage 214 such that the reticle library 227 can vertically move by means of a slide apparatus 229, and N number (N is an integer equal to two or more) of master reticles R1, R2, . . . , RN are placed on a plurality of shelves of the reticle library 227. A reticle loader 245 for exchanging reticles between the reticle library 227 and the reticle stage 214 is also disposed. The main control system 212 controls the operation of the slide apparatus 229 and the reticle loader 245, thereby exchanging the master reticle on the reticle stage 214.

Figure 15B:
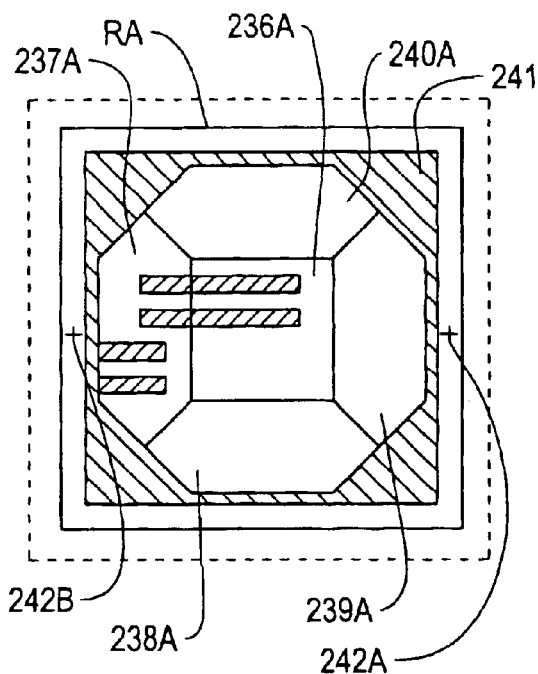
FIGS. 15A, 15B and 15C are diagrams showing a pattern arrangement of a working reticle WR, and pattern arrangement of corresponding master reticle RA and RB produced in the second embodiment of the invention.
Figure 15C:
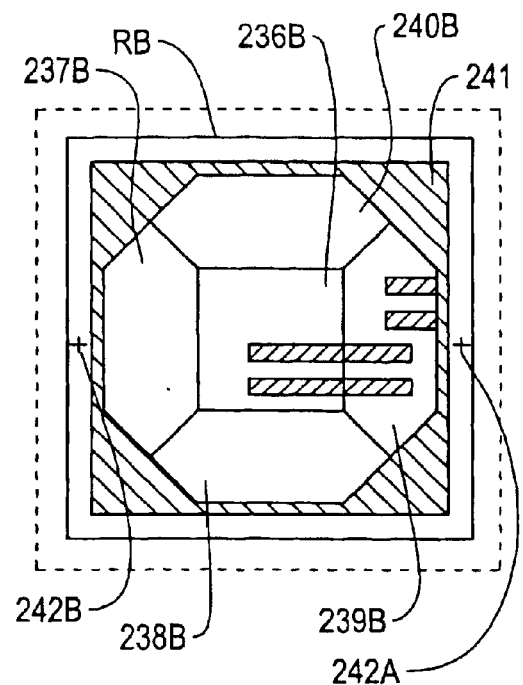
Figure 15A:
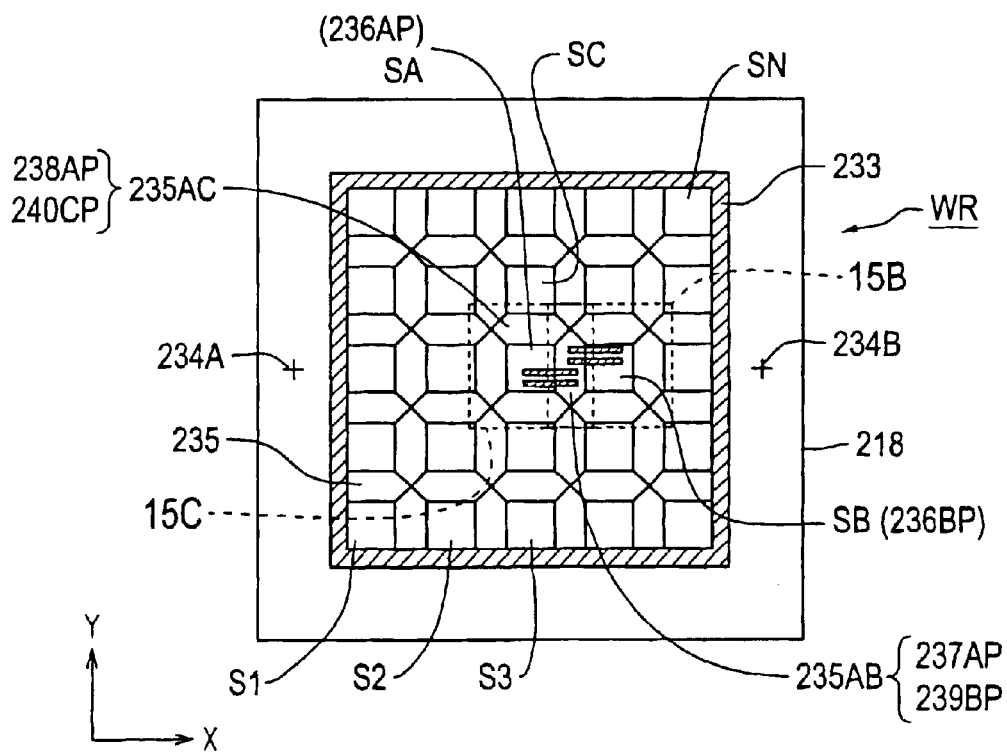

FIGS. 15A, 15B and 15C shows a pattern arrangement of the working reticle WR that is finally produced. In FIGS. 15A 15B and 15C, a direction of the working reticle WR is shown in a state in which the working reticle is placed on the sample stage 219 in FIG. 14. A pattern region surrounded by a rectangular frame-like light shield band 233 is set on the glass substrate 218 of the working reticle WR. In this pattern region, rectangular partial pattern regions S1, S2, S3, . . . , SN are set at predetermined distances from each other and at a predetermined pitch in the X direction and the Y direction (the same pitch in the present embodiment), and a predetermined circuit pattern is formed in each of the partial pattern regions S1 to SN. A predetermined circuit pattern is formed also in each of the boundary regions 235 between the partial pattern regions S1 to SN. A pair of alignment marks 234A and 234B are formed such as to sandwich the light shield band 233 in the X direction. In the present embodiment, the alignment marks 234A and 234B are formed substantially at the same time when the reticle pattern is formed, but the alignment marks 234A and 234B may be previously formed before the reticle pattern is formed.

An outline of the producing procedure of the working reticle WR in the present embodiment is as follows. That is, if the projection magnification of the projection exposure apparatus for carrying out the exposure using the working reticle WR is defined as $\alpha$ ($\alpha$ is ¼, ⅕ of the like for example), a circuit pattern in the light shield band 233 in FIG. 15 having a pattern of a predetermined layer of a semiconductor device or the like that is enlarged $1/\alpha$ times (e.g., four times, five times or the like) is designed in a computer, and the circuit pattern is divided into N number of reticle patterns around the partial pattern regions S1 to SN. At that time, the circuit pattern in the boundary region 235 is formed such as to overlap the adjacent reticle pattern. The N number of reticle patterns are further enlarged $1/\beta$ times ($\beta$ is projection magnification of the projection exposure apparatus in FIG. 14), and the enlarged patterns are formed on the corresponding glass substrates using the electr n beam drawing apparatus, thereby producing the N number of master reticles R1 to RN shown in FIG. 14.

Thereafter, a light shield film such as chromium film is formed on the glass substrate 218 shown in FIG. 14, the photoresist is applied on the light shield film and then, the glass substrate 218 is placed on the sample stage 219 of the projection exposure apparatus. The reduced images of patterns of the master reticles R1 to RN are sequentially exposed to light in regions around the partial pattern regions S1 to SN shown in FIG. 15A Then the development step, the etching step and the like are carried out, thereby producing the working reticle WR. At that time, in the present embodiment, since the reduced images of the patterns of the master reticles R1 to RN formed by the electron beam drawing apparatus are transferred onto the glass substrate 218, influence caused by the pattern-forming error is reduced into $1/\beta$ as compared with a case in which a circuit pattern on a working reticle is directly formed by the electron beam drawing apparatus like the prior art, and the circuit pattern of the working reticle WR is formed with extremely high precision. Further, a line width of each the circuit patterns of the master reticles R1 to RN is about $1/\beta$ times of that of prior art, the pattern-forming time of the electron beam drawing apparatus can be shortened, and even when a plurality working reticles are produced, patterns of the master reticles R1 to RN only may be transferred. Therefore, it is possible to largely shorten the producing time of a plurality working reticles as a whole. Further, of the master reticles R1 to RN, those having the same pattern can be the same, the producing time of the master reticles can further be shortened.

The master reticle of the present embodiment may be produced using the reticle producing system 41 in the first embodiment (FIG. 1). A master reticle may be produced using resist including coloring matter to eliminate the etching treatment. In portions (stitched portions) of the master reticles corresponding to the boundary region 235 of the working reticle, exposure to carried out twice. Therefore, in order to uniform the exposure light amount, an outside portion of the linear pattern may previously be tapered.

When the reduced images of the patterns of the master reticles R1 to RN are exposed on the glass substrate 218 shown in FIG. 15, the reduced images of the patterns of the two master reticles are exposed to light twice in the boundary region 235. To explain this concretely, master reticles corresponding to two partial pattern regions SA and SB disposed adjacent to each other on the central portion of the glass substrate 218 are defined as master reticles RA and RB. In the master reticle RA, rhombus overlapping portions 237A, 238A, 239A and 240A are formed such that they are in contact with four sides of a central square single exposure portion 236A. A light shield band 241 is formed such as to surround the overlapping portions 237A to 240A. A circuit pattern on the working reticle WR is enlarged 1/β times is formed on each of the single exposure portion 236A and the overlapping portions 237A to 240A. A pair of alignment marks 242A and 242B are formed outside of the light shield band 241 with a predetermined positional relation with respect to the single exposure portion 236A.

Similarly, also in the master reticle RB, a circuit pattern on the working reticle WR is enlarged 1/β times and formed in each of the overlapping portions 237B to 240B which are in contact with a central single exposing portion 236B and four sides thereof. Alignment marks 242A and 242B are formed outside of the light shield band 41 surrounding the overlapping portions 237B to 240B with a predetermined positional relation with respect to the single exposure portion 236B. A pattern of the left overlapping portion 237A of the one master reticle RA is the same as a pattern of the right overlapping portion 239B of the other master reticle RB. Linear patterns shown with oblique lines formed in the master reticles RA and RB in FIG. 15 are on example of the circuit pattern, and in reality, a finer pattern is formed.

Reduced images of the master reticles RA, RB are projected on regions around the partial pattern regions SA, SB. As a result, an image 236AP of a single exposure portion 236A and a result, an image 236BP of a single exposure portion 236B are projected in the partial pattern regions SA, SB, respectively, and an image 237AP of the overlapping portion 237A and an image 237BP of the overlapping portion 237B are overlapped and projected in a rhombus boundary 35AB between the partial pattern region SA and SB. An image is inverted and projected by the projection optical system PL2 shown in FIG. 14. An image 238AP of an overlapping portion 238A and an image 240CP of an overlapped of the master reticle corresponding to the partial pattern region SC are overlapped and projected in the boundary region 235AC between the partial pattern region SA and the partial pattern region SC in the Y direction. Similarly, pattern images of two master reticles are overlapped and projected in another boundary region 235.

When the pattern images of two master reticles are overlapped and projected in the boundary region 235 in this manner, the stitching error in the boundary region 235 can be reduced, but if the images are merely overlapped and exposed to light, the exposur light amount in the boundary region 235 is twice as great as the exposure light amount in the partial regions S1 to SN, and uniformity of the exposure light amount distribution can not be obtained. In order to make the exposure light amount in the boundary region 235 equal to that in the partial pattern regions S1 to SN, and make the distribution flat, when the pattern images of the master reticles R1 to RN are exposed to light, the exposure light amount of the overlapping portion is set smaller as approaching the periphery. A manner to expose the pattern image of the one of master reticle RA will be explained with reference to FIGS. 16 to 18.

FIG. 16 is a perspective view of an essential portion showing a state in which a pattern image of the master reticle RA is exposed to light using the projection exposure apparatus shown in FIG. 14. In FIG. 16, it is assumed that up to the partial pattern region upstream from the partial pattern region SA on the glass substrate 18 has already been exposed to light. Immediately after the master reticle RA is placed on the reticle stage 214 shown in FIG. 14, positioning of the sample stage 219 (wafer stage 220 in FIG. 14) is carried out such that centers of the reference marks 231A and 231B on the reference mark member 224 substantially coincide with a center (optical axis) of the exposure region 230 of the projection optical system PL2, Then, positional deviation amounts of the alignment marks 242A and 242B of the mast r reticle RA with respect to the images of the reference marks 231A and 231B is detected, and the positioning of the reticle stage 214 shown in FIG. 14 is carried out such that the positional deviation amounts are symmetric with respect to each other and become minimum. With this operation, the center (exposure center) of the pattern image of the master reticle RA is positioned with respect to the centers of the reference marks 231A and 231B. That is, the alignment of the reticle of the master reticle RA is completed.

In this case, since the positional relation between the partial pattern regions S1 to SN is previously stored in the exposure data file 213, if a moving amount of the reference mark member 224 is defined as a reference when the first partial pattern region S1 on the glass substrate 218 shown in FIG. 16 as one example is exposed to light, a moving amount of the reference mark member 224 (wafer stage 220 in FIG. 14) for bringing the centers of the subsequent partial pattern regions S2 to SN into coincidence with the exposure center can be calculated. Further, it is also possible to previously form the alignment marks 234A and 234B on the glass substrate 218 shown in FIG. 16, and to detect positions of the alignment marks 234A and 234B using the alignment sensor 225, thereby bringing the centers of the subsequent partial pattern regions S2 to SN into coincidence with the exposure center.

The main control system 212 first aligns the center of the partial pattern region SA with the exposure center by driving the wafer stage 220 based on the moving amount of the wafer stage 220 with respect to the partial pattern region SA. Then, by driving the reticle stage 214 in a direction crossing the X axis in a clockwise direction at 45°, the single exposure portion 236A of the master reticle RA is inscribed with sides of the illumination region 210 in the +X direction and the −Y direction. At that time, the overlapping portions 237A and 240A are inscribed with sides of the illumination region 210 in the −X direction and +Y direction. At this stage, the irradiation of the illumination light IL to not yet started. Further, the partial pattern region SA is inscribed with the sides of the exposure region 230 in the −X direction and the +Y direction as shown in FIG. 16 by driving the wafer stage 220 by β times (β is projection magnification) of the moving amount of the reticle stage 214. Then, the irradiation of the illumination light IL is started, the master reticle RA is allowed to move at a constant speed VRT in a direction (a direction of arrow 243R) crossing the Y axis counterclockwisely through 45°, and in synchronously with this, the glass substrate 218 is allowed to move at a speed β×VRT in a direction of an arrow 243W opposit from the arrow 243R. When the overlapping portions 238A and 239A of the master reticle RA are inscribed with the sides of the illumination region 210 in the −Y direction and +X direction, the illumination of the illumination light IL is stopped, and the synchronous moving of the master reticle RA and the glass substrate 218 is also stopped.

FIGS. 17A1, 17B1 and 17C1 show a state in which the master reticle RA moves in a direction of arrow 243R with respect to the illumination region 210. FIGS. 17A1, 17B1 and 17C1 show a state in which the glass substrate 218 moves in a direction of arrow 243W with respect to the exposure region 230 in synchronous with the moving. Size of each of the FIGS. 17A2, 17B2 and 17C2 is actually β times of that of FIGS. 17A1, 17B1 and 17C1.

As can be seen from FIG. 17A1, if a width of the single exposure portion 236 of the master reticle RA in the X direction is defined as L5, and widths of the overlapping portions 237A and 239A in the X direction are commonly defined, as L4, and a width of the illumination region 210 in the X direction is defined as L3, the width L3 of the illumination region 210 is the sum of the width L5 of the single exposure portion 236A and the width L4 of one of the overlapping portions 237A as shown in the following equation:

$$L3 = L5 + L4 \qquad (4)$$

Similarly, a width of the illumination region 10 in the Y direction is the sum of a width of the single exposure portion 236A in the Y direction and a width of the one overlapping portion 240A in the Y direction. As shown in FIGS. 17A1 to 17C1, the master reticle RA moves in the X direction with respect to the exposure light region 210 by the width L4 of the overlapping portion 237A in the X direction, and moves in the Y direction by a width L6 (L6=L4 in the present embodiment) of the overlapping portion 240A in the Y direction. As a result, as shown in FIGS. 17A2 to 17C2, on the glass substrate 218, the image 236AP of the single exposure portion 236A is exposed to light on the partial pattern region SA, and the images 237AP to 240AP of the overlapping portions 237A to 240A are exposed to light such that they are in contact with the image 236AP. The image 236AP is always exposed to light, but the exposure time of the images 237AP to 240AP in the periphery of the image 236AP at their inner sides is longer, and the exposure time of the images 237AP to 240AP at their outer sides is sorter. Therefore, as shown in FIG. 17C2, on the glass substrate 218 after the exposure is completed, a distribution of the accumulated exposure light amount on a cross section along a line AA crossing the image 236AP in the X direction draws a slop at its end portion. That is, the distribution of the accumulated exposure light amount draws a trapezoid in which the overlapping portions are inclined as shown with a curved line 244A in FIG. 18A.

Figure 18A:
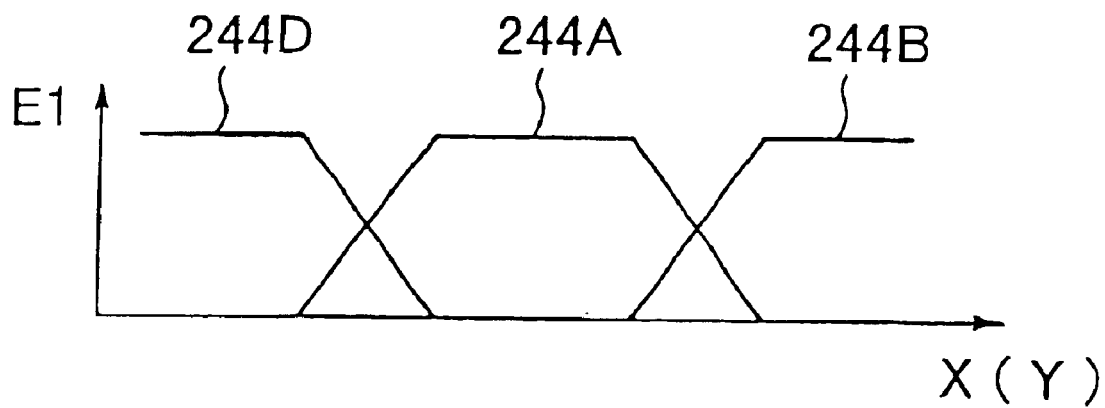
FIGS. 18A and 18B are diagrams showing one example of distribution of an integrating exposure light amount obtained by exposure action of FIGS. 17A1, 17A2, 17B1, 17B2, 17C1 and 17C2.

In FIG. 18A, a lateral axis shows a position on the glass substrate 218 in the X direction, and a vertical axis shows the accumulated exposure light amount Exposure control apparatus 1 at a position X. Similarly, a distribution of the accumulated exposure light amount on the cross section along a line BB crossing the image 236AP shown in FIG. 17C2 in the Y direction also draws a trapezoid like the curved line 244A in FIG. 18A.

Figure 18B:
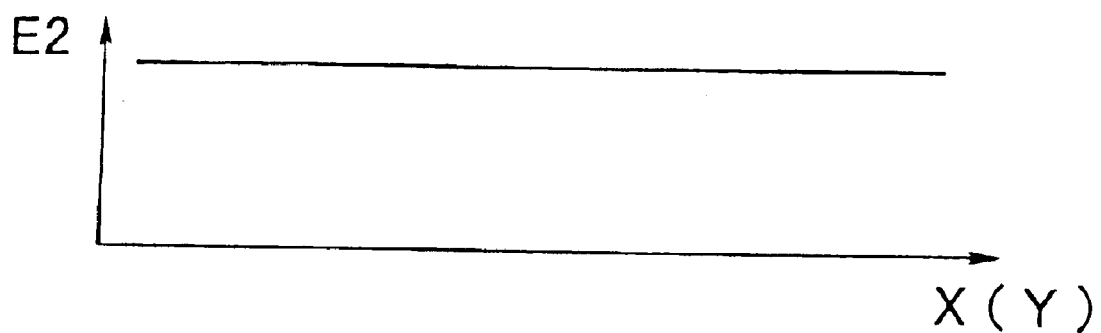

In the present embodiment, in FIG. 16, exposure is carried out such that a trapezoidal accumulated exposure light amount distribution in the X direction and the Y direction can be obtained also in regions sandwiching the partial pattern region SA on the glass substrate 218. Therefore, accumulated exposure light amount distributions on the opposite sides of the accumulated exposure light amount distribution shown with a curved line 244A in FIG. 18A also draw trapezoidal shapes, and a distribution of the accumulated exposure light amount Excimer laser light source 2 on the glass substrate 218 alter images of all the master reticles R1 to RN are exposed to light is flat as shown in FIG. 18B. Similarly, a distribution of the accumulated exposure light amount in the Y direction is also flat. In the present embodiment, exposure time with respect to each of the master reticles R1 to RN is set such that a maximum value of the trapezoidal accumulated exposure light amount distribution such as the curved line 244A, i.e., a value of the accumulated exposure light amount Excimer laser light source 2 shown in FIG. 18B becomes an appropriate exposure light amount for photoresist applied on the glass substrate 218. With this setting, the accumulated exposure light amount after the images of the master reticles R1 to RN are exposed to light on the glass substrate 218 in FIG. 15A becomes a flat appropriate exposure light amount in both the partial pattern regions S1 to Sn and the boundary region 235, and high resolution can be obtained also in the boundary region 235 after development.

Further, in the present embodiment, in FIG. 16, alignment of each master reticle is carried out using the RA microscopes 232A, 232B and the reference mark member 224. Therefore in the boundary region 235AB that is in contact with the partial pattern region SA shown in FIG. 15, the image 237AP of the overlapping portion 237A and the image 239BP of the overlapping portion 289B are overlapped with high precision, and in the boundary region 235AC that is in contact with the partial pattern region SA, the image 238AP of the overlapping portion 238A and the image 240CP of the other mast r reticle are overlapped with high precision. Ther for , the stitching error in the entire boundary region 235 is reduced.

In the present embodiment, since the reticle blind 207 shown in FIG. 14 is the same as the reticle blind for a normal projection exposure apparatus, even if the aperture variable plate 205 is rotated to switch the illumination conditions, the accumulated exposure light amount distribution of each the master reticle on the glass substrate 218 is of trapezoidal shape, and a flat accumulated exposure light amount distribution as a whole can be obtained.

In order to expose a device of a line and space pattern (L/S pattern) of a width of 30 to 180 nm in the future, it is necessary to use a working reticle on which an L/S pattern of a width of 120 to 800 nm is formed. According to the above embodiment, it is possible to produce such a working reticle in a short time with high precision. Even if the glass substrate 18 is 9×9 inches in size, the working reticle can be produced with high precision. As a projection exposure apparatus for producing the working reticle, in order to produce an L/S pattern having a width of 150 to 180 nm for producing a normal semiconductor device, a projection exposure apparatus using an excimer laser light source such as a KrF excimer laser (wavelength is 248 nm) or an ArF excimer laser (wavelength is 193 nm) can be used. Th r fore, ther is almost no apparatus that must be newly developed, and this is advantageous in terms of producing cost.

Next, a third embodiment of the invention will be explained with reference to FIGS. 14, 19A to 21C2. Like the second embodiment, in the present embodiment also, one working reticle is produced by exposing images of patterns of a plurality of master reticles on predetermined substrates while stitching screens. The third embodiment is different from the second embodiment in that a scanning exposure type projection exposure apparatus is used as the exposure apparatus.

That is, in a step and scan type projection exposure apparatus as the scanning type exposure type apparatus used in the present embodiment, the reticle stage 214 has a function for continuously moving through a length exceeding a width of the pattern region of the master reticle in the X direction while the scanning direction is the X direction. Further, the illumination region set on the master reticle RA by the reticle blind 207 becomes a rectangular region that is thin and longer in a non-scanning direction (Y direction) intersecting with the scanning direction, and the exposure region by the projection optical system PL2 is also rectangular. According to a basic operation, the reticle stage 214 is driven, the master reticle is moved at a constant speed VR in the +X direction (or −X direction) with respect to the illumination region, in synchronous with this movement, the wafer stage 220 is driven, and the glass substrate is moved at a speed β×VR in the −X direction (or +X direction) with respect to the exposure region. When this scanning exposure is started or completed, a movable blind 211 shown with a phantom line is disposed close to the reticle blind 7. The movable blind 211 is driven in synchronous with the reticle stage 214 by the reticle state driving system 217. The other structures are the same as those of the second embodiment.

Even when the scanning and exposure are carried out and the screens are stitched in this manner, like the case of the working reticle WR in FIG. 15A, in order to reduce the stitching error, images of overlapping portions of two master reticles are overlapped and exposed in a boundary region between the adjacent two partial pattern regions. Further, in order to uniform the exposure light amount distribution, in the overlapping portions, the exposure light amount is set smaller as approaching its outer side.

Figure 19A:
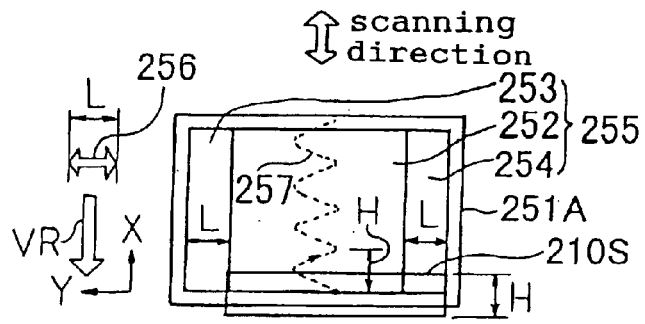
FIGS. 19A to 19F are explanatory diagrams when exposure is carried out while moving a master reticle 251A and a glass substrate 259 in synchronism with each other in a third embodiment of the invention.

FIGS. 19A to 19F are explanatory diagrams when a reduced image of a predetermined master reticle 251A is transferred onto the glass substrate 259 in a scanning exposure manner using the above projection exposure apparatus. In FIG. 19A, th illumination region 210S that is thick and longer in the Y direction is irradiated with illumination light at the time of exposure. In the pattern region 255 of the master reticle 251A, the overlapping portions 253 and 254, are disposed such as to sandwich the central single exposure portion 252 in the X direction, and the images of the patterns in the overlapping portions 253 and 254 are overlapped with an image of a pattern of the overlapping portion of another master reticle (not shown). Therefore, in order to obtain a flat accumulated exposure light amount as a whole, it is necessary to obtain a trapezoidal exposure light amount distribution by lowering the exposure light amount as approaching the outer side when the images of patterns of the overlapping portions 253 and 254.

One example of exposure operation, for obtaining the trapezoidal exposure light, amount distribution in the scanning exposure manner using the reticle blind having a normal opening as in the present embodiment will be explained. First, in FIGS. 19A and 19B, a width of the single exposure portion 252 in the Y direction (non-scanning direction) is defined as L1, a width of the overlapping portions 253 and 254 in the Y direction is defined as L, a width of the illumination region 210S in the Y direction is defined as L2, and a width of the illumination region 210S in the X direction (scanning direction) is d fin d as H. Then, the width L2 of the illumination region 210S in the Y direction is the sum of the width L1 of the single exposure portion 252 and the width L of the overlapping portion 253 as follows.

$$L2 = L1 + 1 \tag{5}$$

Figure 19B:
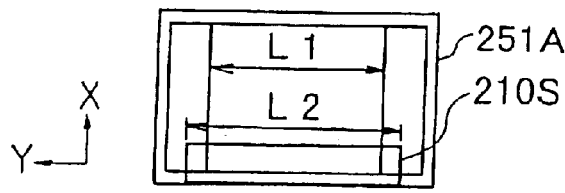
Figure 19C:
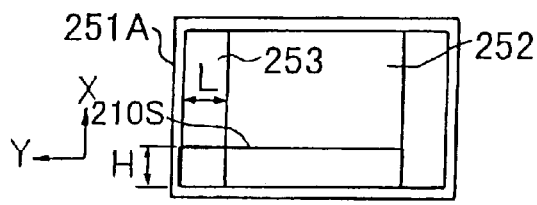
Figure 19D:
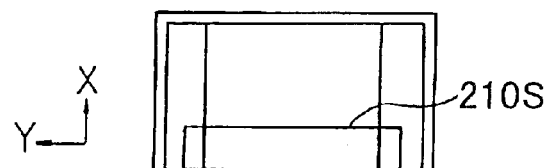
Figure 19E:
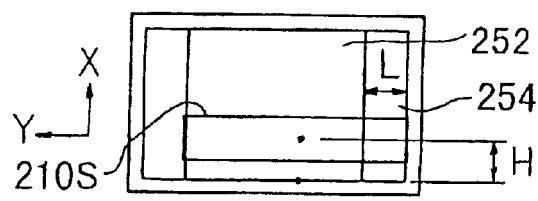
Figure 19F:
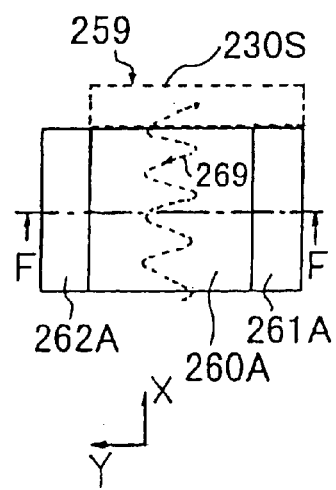

Then, in order to transfer the image of the pattern of the master reticle 251A onto the glass substrate 259 in FIG. 19F in the scanning exposure manner, first, like the second embodiment, the master reticle 251A and the glass substrate 259 are aligned with each other. Then, the irradiation of the illumination light in the illumination region 210S is started, and as shown in FIGS. 19A to 19E, the master reticle 251A is allowed to move at a constant speed VR in the −X direction (or +X direction). Further, with this movement, the master reticle 251A is vibrated with at amplitude of L in the Y direction (non-scanning direction) such that the master reticle 251A does not project outward from the overlapping portions 253 and 254 as shown with an arrow 256. The cycle TR of the vibration satisfies the following condition using one or higher integer n.

$$TR = H/(n \times VR) \tag{6}$$

This means that the master reticle 251A is vibrated n times in the Y direction while the master reticle moves by a width H of the illumination region 210S in the X direction. FIGS. 19A to 19B shows a case in which n=1. As a result, in a system in which the master reticle 251A is at a rest, the center of the illumination region 210 moves relative to the master reticle 251A along sinusoidal wave along a locus 257 shown with dotted line in FIG. 19A. Further, since the glass substrate 259 moves in the opposite direction from the master reticle 251A with speed ratio of projection magnification β, in a system in which the glass substrate 259 is at a rest, the illumination region 230S moves relative to the glass substrate 259 along a locus 269 shown with dotted line in FIG. 19F. With this, a reduced image of the single exposure portion 252 is exposed in the partial pattern region 260A above the glass substrate 259, and reduced images of the overlapping portions 253 and 254 are exposed in the boundary regions 261A and 162A.

Figure 20:
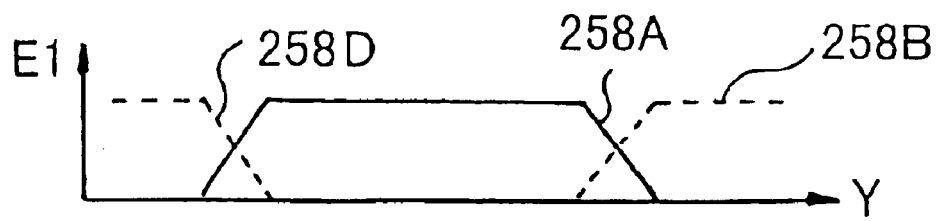
FIG. 20 is a diagram showing one example of distribution of an integrating exposure light amount obtained by exposure action of FIGS. 19A to 19F; and FIGS., 21A1, 21A2, 21B1, 21B2, 21C1 and 21C2 show exposure action in the third embodiment of the invention, and modifications thereof.

A distribution of an accumulated exposure light amount Exposure control apparatus 1 at a cross section along a line FF that is in parallel to the Y direction above the glass substrate 259 in FIG. 19 after the scanning and exposure are completed forms a trapezoidal shape that is gradually lowered at the overlapping portions 261A and 262A as shown with a curved line 258A in FIG. 20. In this also, the accumulated exposure light amount around the left and right partial pattern regions also shows trapezoidal shape that is gradually lowered at the overlapping portion as shown with curved lines 258B and 258D. Therefore, the accumulated exposure light amount becomes uniform and flat as a whole, the stitching error is reduced, and high resolution can be obtained.

After the scanning and exposure in the present embodiment as shown with the curved line 266a in FIG. 21A, in order to obtain a completely trapezoidal exposure light distribution, in the system in which the glass substrate 259 is at a rest, as shown with a locus 263 in FIG. 21A1, it is preferable that the exposure region 230S moves along a triangular waveform, At that time, the exposure light amount distributions in adjacent regions are as shown with the curved line 266B, and a flat exposure light amount distribution shown with a straight line 266 can be obtained.

However, in reality, as shown with a locus 264 shows with a solid line in FIG. 21B1 or a locus 265 shown with a solid line in FIG. 21C1 the exposure region 230S may be moved in a state in which the exposure region 230S is folded into sinusoidal wave shape or reversed sinusoidal wave relative to the glass substrate (special control having existing probability at peripheral portion). When the exposure region 230S is moved along the sinusoidal wave, accumulated exposure light amount that is varied in the form of the sinusoidal wave at the adjacent opposite end regions shown with the curved lines 267A and 267B in FIG. 21B2, and a flat exposure light amount distribution as a whole as shown with a straight line 267 can be obtained. On the other hand, when the exposure region 230S is moved along the reversed sinusoidal wave, as shown with the curved lines 268A and 268B in FIG. 21C2, an accumulated exposure light amount distribution in which the adjacent opposite ends are varied in a state in which the sinusoidal wave is reversed can be obtained.

In order to move the master reticle 251A and the glass substrate 259 with high precision along the substantially sinusoidal wave like locus, the reticle stage 214 and the wafer stage 220 in FIG. 14 are driven with forward control, and only remaining error monitored by the laser interferometers 216 and 222 is corrected by feedback control. When it is difficult to achieve the synchronous control and vibration control for scanning and exposure using the same actuator, another actuator may be provided. In such a case, it is preferable that a counter weight mechanism and a reaction canceling mechanism are mounted to each of the actuators so that the actuators do not affect each other.

Although a case in which the overlapping portions are provided in the non-scanning direction in the above embodiment, the overlapping portions can be overlapped two-dimensionally and exposed in the scanning and exposing manner as shown in FIG. 15. For this purpose, a width of the illumination region is controlled using the movable blend 211 shown in FIG. 14 or illumination itself of the illumination light is controlled at the time of starting and completing in the scanning direction.

The exposure method of the third embodiment may be applied to a case in which a reticle is produced in the first embodiment.

Except portions concerning FIGS. 9A to 13C in the first embodiment, "stitching exposure" in each of the embodiment has nothing to do with the presence or absence of stitched portions of the adjacent patterns, i.e., pattern portions to be actually overlapped. In other words, when a first region on a substrate to which a first pattern is to be transferred and a second region on a substrate to which a second pattern is to be transferred are partially overlapped, it is called "stitching exposure" irrespective of the presence or absence of patterns (stitching portions) to be actually overlapped.

In each of the embodiments, a plurality of master reticles may be placed on the reticle stage, and a required master reticle may be moved to the exposure position by driving the reticle stage. With this design, the exchanging time of the master reticle can be shortened. Especially, in the case of the scanning exposure type exposure apparatus, a plurality master reticles may be arranged and held on the reticle stage along a direction (scanning direction) along which the master reticle is moved at the time of scanning and exposing.

Further, although the fly eye lens is used as the optical integrator (homogenizer) in each of the above embodiments, a rod integrator may be used instead, or two or more fly eye lenses and or rod integrators may be disposed. In order to change the illumination conditions, the switching revolver 5 (FIG. 2) or the aperture variable plate 205 (FIG. 14) is used in the embodiment, but instead of them or together with them, an optical element (axi-con, zoom lens or the like) disposed closer to the light source than the optical integrator may be moved to change the intensity distribution of the illumination light, the projection optical system may be of refractive, reflective, or catadioptric.

In each of the above embodiments, the working reticle may be any of reflective type or transparent type, a material of the substrate is not limited to synthetic quartz, quartz doped with fluorine, and silicon wafer, and may be arbitrary material. The size of the substrate material is not limited to 6×6 inches, or 9×9 inches.

Although a case in which the transparent working reticle for projection exposure apparatus using ultraviolet light is produced in each of the above embodiments, the present invention cal also b appli d to produce a reflective type working reticle for an exposure apparatus using extreme ultraviolet light (EUV light) having wavelength of about 5 to 50 nm such as soft X-ray. The invention can also be applied to produce an actually exposing mask of a membrane structure for the electron beam drawing apparatus.

As an exposure apparatus used for producing the above working reticle, in addition to the optical type projection exposure apparatus, a cell projection type exposure beam exposure apparatus for carrying out the exposure by deviating exposure beam can be used. In this exposure beam exposure apparatus, since aberration is generated when the exposure beam is deviated, exposure may be carried out only in a narrow region in the non-scanning direction in some cases. In such a case, in the above embodiment, the mask and the substrate move in the non-scanning direction in synchronously, and it is unnecessary to drive the aperture portion and the cell portion in synchronously for shaping the exposure beam into the cell. Therefore, there is merit that exposure can be carried out in a wide region in the non-scanning direction with a simple structure.

When a semiconductor device or the like is produced, in a procedure for exposing a circuit pattern in each shot regions above a wafer for example, the invention can also be applied to expose r duced images of a reticl s while stitching screens. With this feature, it is possible to produce a device having excellent response speed and high function.

As the exposure apparatus of the above embodiment, the invention also can be applied to a proximity exposure apparatus for bringing a mask and a substrate into close contact with each other to expose a pattern of the mask without using a projection optical system.

The uses of the exposure apparatus are not limited to an exposure apparatus for producing a mask or a semiconductor device, and the invention can widely be applied to an exposure apparatus for a liquid crystal display or a plasma display that exposes liquid crystal display element pattern on a rectangular glass plate, or an exposure apparatus for producing a thin film magnetic head.

As illumination light (exposure beam) for exposure of an exposure apparatus in each of the above embodiments, it is possible to use not only g-line (436 nm), i-line (365 nm). KrF excimer laser (248 nm), ArF excimer laser (193 nm), $F_2$ laser (157 nm) and $Ar_2$ laser light (126 nm), but also harmonic obtained in such a manner that single wavelength laser in infrared range or visible range oscillated from DFB semiconductor device laser or fiber laser is amplified by a fiber amplifier doped with erbium (Er) (or both erbium and ytterbium (Yb)), and the resultant is wavel ngth-converted into ultraviolet light using non-linear optical crystal. When exposure beam is used as the EUV light, reflective type resolution is used as the master reticle. As projection optical system, it is possible to use a reflective system comprising a plurality of (about three to eight for example) reflective optical element whose one side closer to an object is non-telecentric and one side closer to image is telecentric.

Further, charged particle beam such as X-ray or exposure beam can be used as the exposure beam. When the exposure beam is used for example, it is possible to use thermionic emission type lanthanum hexaboride ($LaB_6$) or tantalum (Ta). The scaling of the projection optical system may be not only scale down magnification but also equal magnification (1:1) or scale up magnification.

As the projection optical system, when far ultraviolet rays such as excimer laser is used as projection optical system, far ultraviolet rays-transparent material such as quartz of fluorite is used as glass material, and when $Ar_2$ laser or X-ray is used, catadioptric system or refractive system is used (reflective reticle is used), and when exposure beam is used, polariscope comprising electron lens and electron optical system is used as optical system. An optical path through which exposure beam passes is und r vacuum of course.

It is possible to produce the exposure apparatus of the above embodiment by incorporating an illumination optical system comprising a plurality lenses and a projection optical system into an exposure apparatus body, mounting a reticle stage and a wafer stage comprising a large number of mechanical parts to the exposure apparatus body, connecting wires or tubes, and totally adjusting the exposure apparatus body (adjusting electric portions, checking operations and the like). It is preferable to produce the exposure apparatus in a clean room where a temperature and a degree of cleanness are controlled.

The exposure apparatus method of the above embodiment can also be applied to produce other than the mask, e.g., a semiconductor device. For example, the semiconductor device is produced through a step for designing a function and a performance of the device, a step for producing a reticle based on this step, a step for producing a wafer from silicon material, a step for exposing a pattern of the reticle to the light by the exposure apparatus of the above-described exposure apparatus (exposure method), a step for assembling the device (including dicing step, bonding step, and packaging step), and an inspection step.

The entire disclosure of Japanese Patent Application No. 10-169721 filed on Jun. 17, 1998 including specification, claims, drawings and summary and the entire disclosure of Japanese Patent Application No. 10-290181 filed on Oct. 13, 1998 including specification, claims, drawings and summary, are incorporated herein by reference in their entirety.

Although various exemplary embodiments have been shown and described, the invention is not limited to the embodiments shown. Therefore, the scope of the invention is intended to be limited solely by the scope of the claims that follow.

What is claimed is:

1. A scanning exposure method for scanning and exposing a pattern of a mask in a predetermined direction multiple times and transferring a desired pattern onto a substrate by stitching the pattern multiple times, the method comprising:

scanning the mask and the substrate in the predetermined direction synchronously with illumination light of an illumination region defined by an aperture stop which illuminates a pattern region of the mask to project the pattern onto the substrate; and in order to overlap patterns adjacent to each other in a scanning direction on the substrate to form the desired pattern, stitching the patterns by controlling an aperture shape of the aperture stop to control an exposure amount distribution in the predetermined direction in a stitching region which extends toward a direction intersecting the predetermined direction and in which the patterns are overlapped.

2. A scanning exposure method as recited in claim 1, wherein
an exposure amount of the stitching region is controlled by changing a width in the scanning direction of the aperture stop of the illumination region which illuminates the mask.

3. A scanning exposure method as recited in claim 1, wherein
at a starting time and at an ending time of the scanning and exposing of the pattern region of the mask, an opening operation and a closing operation of the aperture stop are performed synchronously with the scanning and exposing.

4. A scanning exposure method as recited in claim 1, wherein
an exposure amount of the stitching region is controlled by controlling a light amount of the illumination light which illuminates the mask.

5. A scanning exposure method as recited in claim 1, wherein
the stitching of the patterns of the mask is performed by partially overlapping patterns formed to be adjacent to each other in the direction which intersects with the scanning direction.

6. A scanning exposure method as recited in claim 1, wherein
the scanning and exposing is performed with a projection optical system which transfers the pattern of the mask and that is provided between the mask and the substrate, and with a correcting plate which corrects a predetermined image-forming characteristic and that is disposed in the projection optical system.

7. A scanning exposure method as recited in claim 1, wherein
the scanning and exposing is performed in order for an exposure amount of the partially overlapped region to have an exposure amount distribution of a trapezoidal shape in which the exposure amount becomes lower toward outer sides of the pattern of each mask to be exposed.

8. A scanning exposure method as recited in claim 1, wherein
a projection optical system which transfers the pattern of the mask is provided between the mask and the substrate and the pattern of the mask is scanned and exposed onto the substrate by an approximately 1:1 magnification.

* * * * *